(12) United States Patent
Hayashi et al.

(10) Patent No.: US 10,432,880 B2
(45) Date of Patent: Oct. 1, 2019

(54) IMAGING APPARATUS, IMAGING SYSTEM, AND DRIVING METHOD FOR IMAGING APPARATUS

(71) Applicant: CANON KABUSHIKI KAISHA, Tokyo (JP)

(72) Inventors: Hidetoshi Hayashi, Fujisawa (JP); Shintaro Takenaka, Yokohama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 122 days.

(21) Appl. No.: 15/360,833

(22) Filed: Nov. 23, 2016

(65) Prior Publication Data

US 2017/0155857 A1 Jun. 1, 2017

(30) Foreign Application Priority Data

Nov. 30, 2015 (JP) ................. 2015-233675

(51) Int. Cl.
| | |
|---|---|
| H04N 5/355 | (2011.01) |
| H04N 5/353 | (2011.01) |
| H01L 27/146 | (2006.01) |
| H04N 5/341 | (2011.01) |
| H04N 5/378 | (2011.01) |
| H04N 5/3745 | (2011.01) |

(52) U.S. Cl.
CPC ..... H04N 5/3559 (2013.01); H01L 27/14609 (2013.01); H01L 27/14623 (2013.01); H01L 27/14638 (2013.01); H04N 5/341 (2013.01); H04N 5/3532 (2013.01); H04N 5/35572 (2013.01); H04N 5/378 (2013.01); H04N 5/37457 (2013.01)

(58) Field of Classification Search
CPC .. H04N 5/341; H04N 5/3532; H04N 5/35536; H04N 5/35572; H04N 5/3559; H04N 5/37457
See application file for complete search history.

(56) References Cited

U.S. PATENT DOCUMENTS

| | | | | |
|---|---|---|---|---|
| 6,246,436 B1* | 6/2001 | Lin | ............... | G01J 1/46 |
| | | | | 257/E27.132 |
| 6,512,544 B1* | 1/2003 | Merrill | ............... | H01L 27/1443 |
| | | | | 250/208.1 |
| 7,697,051 B2* | 4/2010 | Krymski | ............ | H01L 27/14609 |
| | | | | 250/208.1 |
| 8,575,533 B2* | 11/2013 | Yen | ............... | H01L 27/14609 |
| | | | | 250/208.1 |
| 9,924,121 B2* | 3/2018 | Onishi | ............... | H04N 5/3559 |
| 9,929,204 B2* | 3/2018 | Kim | ............... | H01L 27/1463 |
| 2004/0251394 A1* | 12/2004 | Rhodes | ............ | H01L 27/14603 |
| | | | | 250/208.1 |
| 2009/0096890 A1 | 4/2009 | Li | | |
| 2014/0117206 A1* | 5/2014 | Park | ............... | H01L 27/14609 |
| | | | | 250/208.1 |
| 2016/0337567 A1* | 11/2016 | Okura | ............... | H01L 29/945 |

* cited by examiner

*Primary Examiner* — Daniel M Pasiewicz
(74) *Attorney, Agent, or Firm* — Canon U.S.A., Inc. IP Division

(57) ABSTRACT

An imaging apparatus includes a scanning circuit configured to perform shutter scanning and readout scanning, a first control unit configured to control the capacitance setting unit to set a capacitance value of the input node in the readout scanning, and a second control unit configured to control the capacitance setting unit to set a capacitance value of the input node in the shutter scanning.

20 Claims, 25 Drawing Sheets

IMAGING APPARATUS, IMAGING SYSTEM, AND DRIVING METHOD FOR IMAGING APPARATUS

BACKGROUND OF THE INVENTION

Field of the Invention

One disclosed aspect of the embodiments relates to an imaging apparatus, an imaging system, and a driving method for an imaging apparatus.

Description of the Related Art

U.S. Patent Application Publication No. 2009/0096890, Description, discloses an imaging apparatus having a configuration in which transistors and an additional capacitor are serially connected between a floating diffusion and a power supply line within a pixel. In the imaging apparatus, the connection/disconnection of the transistors may be controlled to switch the connection/disconnection between the additional capacitor and the floating diffusion. In accordance with a change in capacitance value of the floating diffusion caused by the operation, the charge-voltage conversion ratio in the floating diffusion changes. For that, the imaging apparatus can set a gain in imaging.

SUMMARY OF THE INVENTION

An aspect of the embodiments provides an imaging apparatus including a pixel array having a plurality of rows of a plurality of pixels, the pixels each including a photoelectric converting unit configured to generate electric charges corresponding to incident light, an amplification transistor having an input node, the amplification transistor configured to output a signal corresponding to electric charges in the input node, a transfer transistor configured to transfer the electric charges generated by the photoelectric converting unit to the input node, a reset transistor configured to reset the input node to a predetermined voltage, and a capacitance setting unit configured to set a capacitance value of the input node, a scanning circuit configured to perform shutter scanning sequentially performing processing of resetting electric charges of the photoelectric converting units on each row of the plurality of pixels by turning on the transfer transistors and the reset transistors and readout scanning sequentially performing processing of transferring electric charges of the photoelectric converting unit to the input node on each row of the plurality of pixels by turning on the transfer transistors, a first control unit configured to control the capacitance setting unit to set a capacitance value of the input node in the readout scanning, and a second control unit configured to control the capacitance setting unit to set a capacitance value of the input node in the shutter scanning.

Another aspect of the embodiments provides a driving method for an imaging apparatus. The imaging apparatus includes a pixel array having a plurality of rows of a plurality of pixels, the pixels each including a photoelectric converting unit configured to generate electric charges corresponding to incident light, an amplification transistor having an input node, the amplification transistor configured to output a signal corresponding to electric charges in the input node, a capacitance setting unit configured to set a capacitance value of the input node. The method includes performing shutter scanning sequentially performing processing of resetting electric charges of the photoelectric converting units on each row of the plurality of pixels and readout scanning sequentially performing processing of transferring electric charges of the photoelectric converting unit to the input node on each row of the plurality of pixels, and separately performing control of the capacitance setting unit to set a capacitance value of the input node in the readout scanning, and control of the capacitance setting unit to set a capacitance value of the input node in the shutter scanning.

Further features of the disclosure will become apparent from the following description of exemplary embodiments with reference to the attached drawings.

DESCRIPTION OF THE EMBODIMENTS

U.S. Patent Application Publication No. 2009/0096890, does not clearly disclose a configuration of a control unit configured to control connection or disconnection of an additional capacitor for a variable gain.

The following technology relates to an imaging apparatus in which a capacitance value of a floating diffusion can be controlled.

An imaging apparatus according to exemplary embodiments will be described with reference to drawings. Like numbers refer to like parts having like functionality in a plurality of drawings, and any repetitive descriptions will be omitted or simplified.

First Exemplary Embodiment

Figure 1:
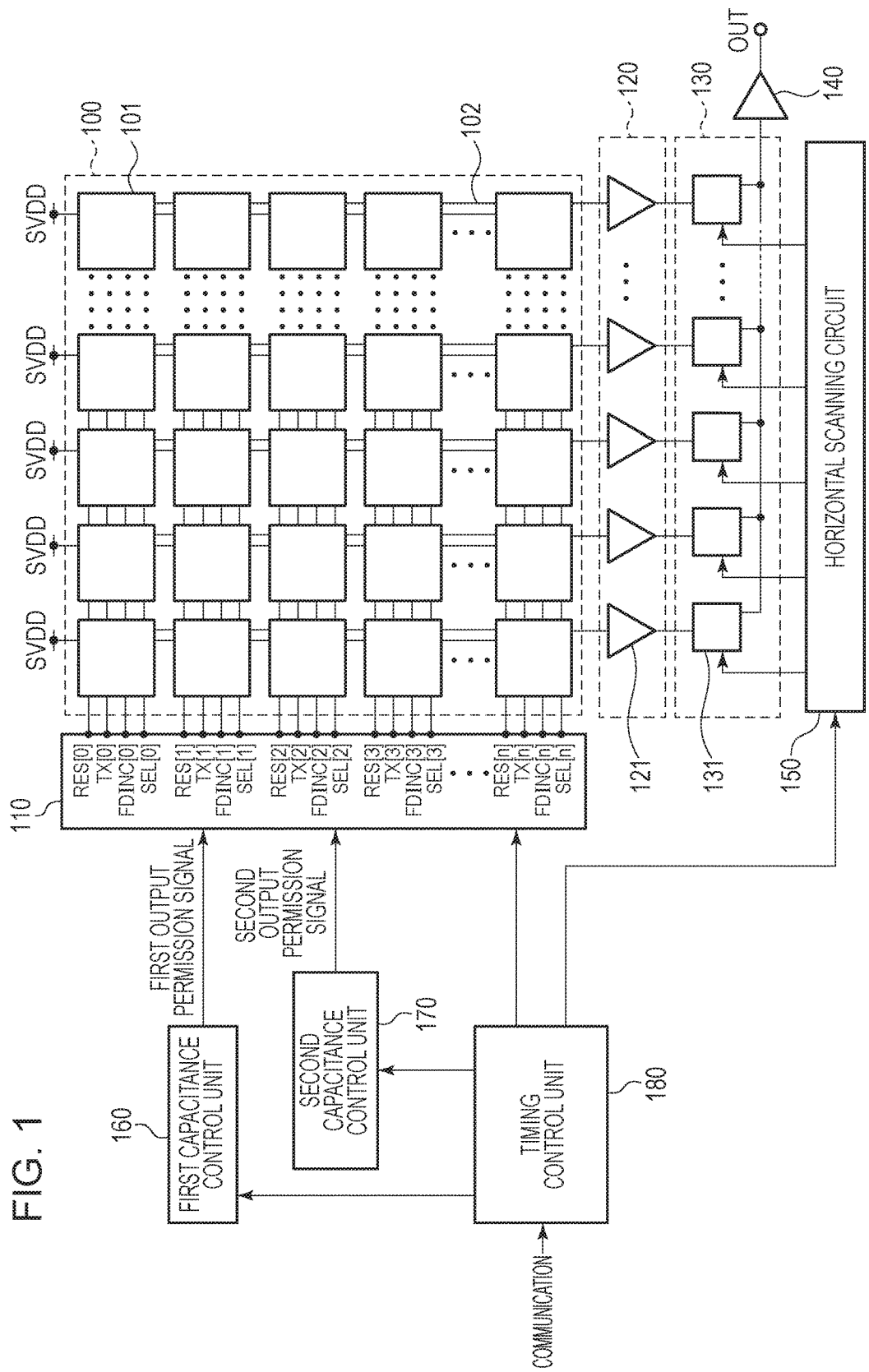
FIG. 1 is a block diagram illustrating a configuration of an imaging apparatus according to a first exemplary embodiment.

FIG. 1 is a block diagram illustrating a configuration of an imaging apparatus according to a first exemplary embodiment. The imaging apparatus includes a pixel array 100, a vertical scanning circuit 110 (VSC), a column readout unit 120, a memory unit 130, an output circuit 140, and a horizontal scanning circuit 150. The imaging apparatus further includes a first capacitance control unit 160, a second capacitance control unit 170, and a timing control unit 180 (TG) for supplying signals to the components for control. The pixel array 100 includes a plurality of pixels 101 arranged in a matrix of a plurality of rows and a plurality of columns. The vertical scanning circuit 110 outputs a plurality of control signals to the pixels 101 in the pixel array 100 row by row. Here, control signals to be supplied from the vertical scanning circuit to the pixels are RES[0] to [n], TX[0] to [n], FDINC[0] to [n], and SEL[0] to [n]. Indices are given to indicate row numbers in the pixel array 100, and such indices may be omitted if identification of a row number is not necessary. Both of row numbers and column numbers start from 0 herein. Therefore, the row number of the pixels 101 is n+1. The pixels 101 are sequentially selected row by row in accordance with the control signals SEL[0] to [n] from the vertical scanning circuit 110 (vertical scanning). Signals output from the pixels 101 of a selected row are read out through a vertical output line 102 provided commonly for each column.

The column readout unit 120 includes a plurality of column readout circuits 121 each provided for a corresponding one column of the pixel array 100. Signals from the pixels 101 are input to the corresponding column readout circuit 121 through a corresponding vertical output line 102. The column readout circuit 121 may have functions such as buffering, amplifying, AD (Analog-to-Digital) conversion, and correlated double sampling.

The memory unit 130 includes a plurality of signal holding units 131 each provided for a corresponding one column of the pixel array 100. In a case where the column readout circuit 121 does not have an AD conversion function, the signal holding unit 131 may be implemented by a sample-and-hold circuit configured to hold an analog signal. In a case where the column readout circuit 121 has an AD conversion function, the signal holding unit 131 may be implemented by a digital memory configured to hold a digital signal.

The horizontal scanning circuit 150 causes the plurality of signal holding units 131 to sequentially output signals held therein in accordance with a control signal from the timing control unit 180. Signals output from the plurality of signal holding units 131 are input to the output circuit 140. The output circuit 140 performs processing such as buffering and amplifying on an input signal and causes an output terminal OUT thereof to output the resulting signal.

The timing control unit 180 operates in response to a signal supplied by serial communication, for example, via a transmission path from an apparatus equipped with an imaging apparatus such as a digital camera. On basis of the communication, the timing control unit 180 supplies signals such as timing signals to the vertical scanning circuit 110, horizontal scanning circuit 150, first capacitance control unit 160, and second capacitance control unit 170. The first capacitance control unit 160 outputs a first output permission signal to the vertical scanning circuit 110 on basis of a signal from the timing control unit 180. The second capacitance control unit 170 outputs a second output permission signal to the vertical scanning circuit 110 on basis of a signal from the timing control unit 180. A method for generating such output permission signals and operations of the vertical scanning circuit 110, the first capacitance control unit 160, and the second capacitance control unit 170 will be described in detail below.

Figure 2:
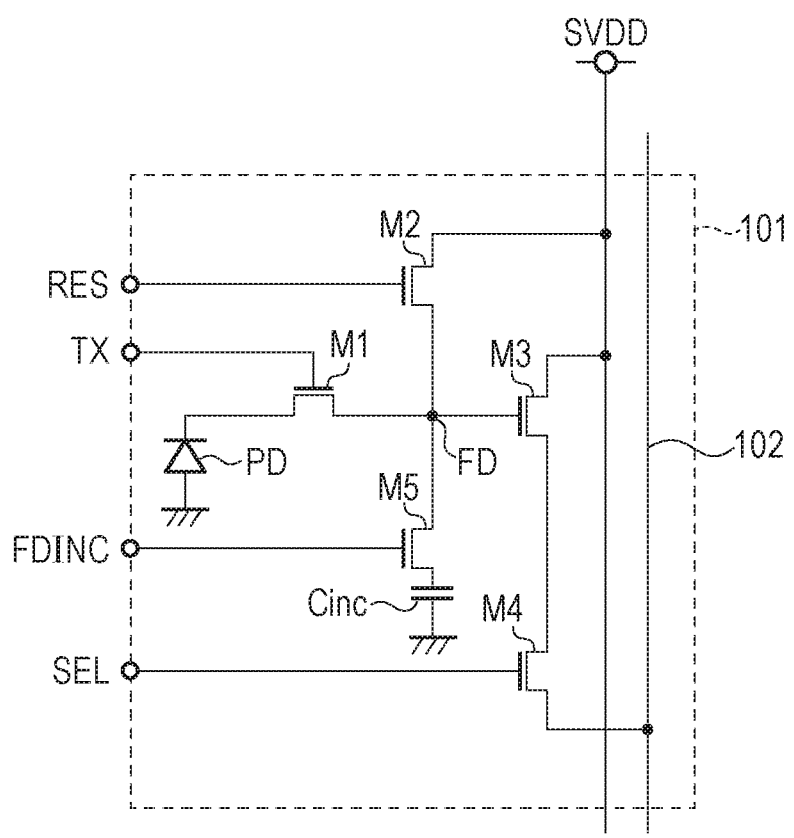
FIG. 2 is a circuit diagram illustrating a configuration of a pixel according to the first exemplary embodiment.

FIG. 2 is a circuit diagram illustrating a configuration of each of the pixels 101 according to the first exemplary embodiment. The pixel 101 has a photoelectric converting unit PD, a transfer transistor M1, a reset transistor M2, an amplification transistor M3, a selection transistor M4, transistor M5, a floating diffusion FD and an additional capacitor Cinc. Assuming here that the transistors are NMOS transistors as an example, they may be PMOS transistors, for example. The transfer transistor M1 has a gate that receives a control signal TX. The reset transistor M2 has a gate that receives a control signal RES. The selection transistor M4 has a gate that receives a control signal SEL.

The photoelectric converting unit PD is an element implemented by a photodiode, for example, and is configured to generate electric charges according to incident light. The following description assumes that the photoelectric converting unit PD is a photodiode. The photoelectric converting unit PD has an anode being grounded and a cathode connected to a source of the transfer transistor M1.

The floating diffusion FD is connected to a drain of the transfer transistor M1, a source of the reset transistor M2, a gate of the amplification transistor M3, and a drain of the transistor M5. In other words, the floating diffusion FD is an input node of the amplification transistor M3. The floating diffusion FD includes an impurity diffusion region provided on a semiconductor substrate and has a predetermined capacitance. The capacitance in the floating diffusion FD may contain a capacitance component generated by a PN junction provided in the impurity diffusion region. A drain of the reset transistor M2 and a drain of the amplification transistor M3 are connected to a power supply line configured to supply a predetermined voltage SVDD. The amplification transistor M3 has a source connected to a drain of the selection transistor M4. The selection transistor M4 has a source connected to the vertical output line 102. The transistor M5 has a source connected to one end of the additional capacitor Cinc. The additional capacitor Cinc has the other end being grounded.

When a control signal TX and a control signal RES are changed to a high level so that the transfer transistor M1 and reset transistor M2 are turned on, the electric charges in the photoelectric converting unit PD and floating diffusion FD are reset. After that, when the control signal TX and control signal RES are changed to a low level so that the transfer transistor M1 and reset transistor M2 are turned off, the accumulation of electric charges to the photoelectric converting unit PD is started from the time. Hereinafter, this series of operations will be called a shutter operation, and a process in which the vertical scanning circuit 110 causes the pixels 101 of a row to sequentially perform the shutter operation will be called shutter scanning.

When the control signal TX is changed to a high level so that the transfer transistor M1 is turned on, electric charges generated and accumulated in the photoelectric converting unit PD by the photoelectric conversion is transferred to the floating diffusion FD. The amplification transistor M3 and a current source, not illustrated, operate as a source follower circuit, and voltage based on the transferred electric charges is output to the vertical output line 102. The voltage output to the vertical output line 102 undergoes a process such as amplification performed by the column readout circuit 121 and is held in the signal holding unit 131. Hereinafter, this series of operations will be called a readout operation, and a process in which the vertical scanning circuit 110 causes the pixels 101 of each row to sequentially perform the readout operation will be called readout scanning. The time period from the shutter operation to the readout operation is an accumulation time when electric charges are accumulated in the photoelectric converting unit PD.

The transistor M5 is turned on or off in accordance with a control signal FDINC so that the connection/disconnection between the floating diffusion FD and the additional capacitor Cinc is changed. This changes the capacitance generated in the floating diffusion FD. In other words, the transistor M5 and the additional capacitor Cinc function as a capacitance setting unit configured to set the capacitance value of an input node. In this case, the conversion ratio or gain of output voltage of the amplification transistor M3 to electric charges transferred to the floating diffusion FD can be changed. When the additional capacitor Cinc is connected to the floating diffusion FD and the capacitance value of the floating diffusion FD increases, a lower gain is produced than that when the additional capacitor Cinc is disconnected (hereinafter, this state will be called a "High FD capacitance"). On the other hand, when the additional capacitor Cinc is disconnected from the floating diffusion FD and the capacitance value of the floating diffusion FD decreases, a higher gain is produced than that when the additional capacitor Cinc is connected (hereinafter, this state will be called a "low FD capacitance"). Thus, the imaging apparatus of this exemplary embodiment can change the gain of the pixels 101 in accordance with the control signal FDINC.

Having described that the additional capacitor Cinc and transistor M5 of this exemplary embodiment may be implemented by two separate elements as illustrated in FIG. 2, an embodiment is not limited to this configuration. It may only be required that at least the two states of the "High FD capacitance" and the "Low FD capacitance" can be acquired. For example, the additional capacitor Cinc and transistor M5 may be implemented by one element having the same functionality. As an example, a MOS type capacitor may be used so that the functionality of the additional capacitor Cinc and transistor M5 may be implemented by one element. One example thereof may be a MOS type capacitor using a capacitance between a MOSFET with source and drain terminals short-circuited and a gate terminal. Because the MOS type capacitor can function as a variable capacitor element having a variable capacitance in accordance with the voltage between the terminals, the MOS type capacitor is applicable as a capacitance setting unit configured to set the capacitance value of an input node. The MOS type capacitor may have one of the source and drain of the MOSFET.

Figure 3:
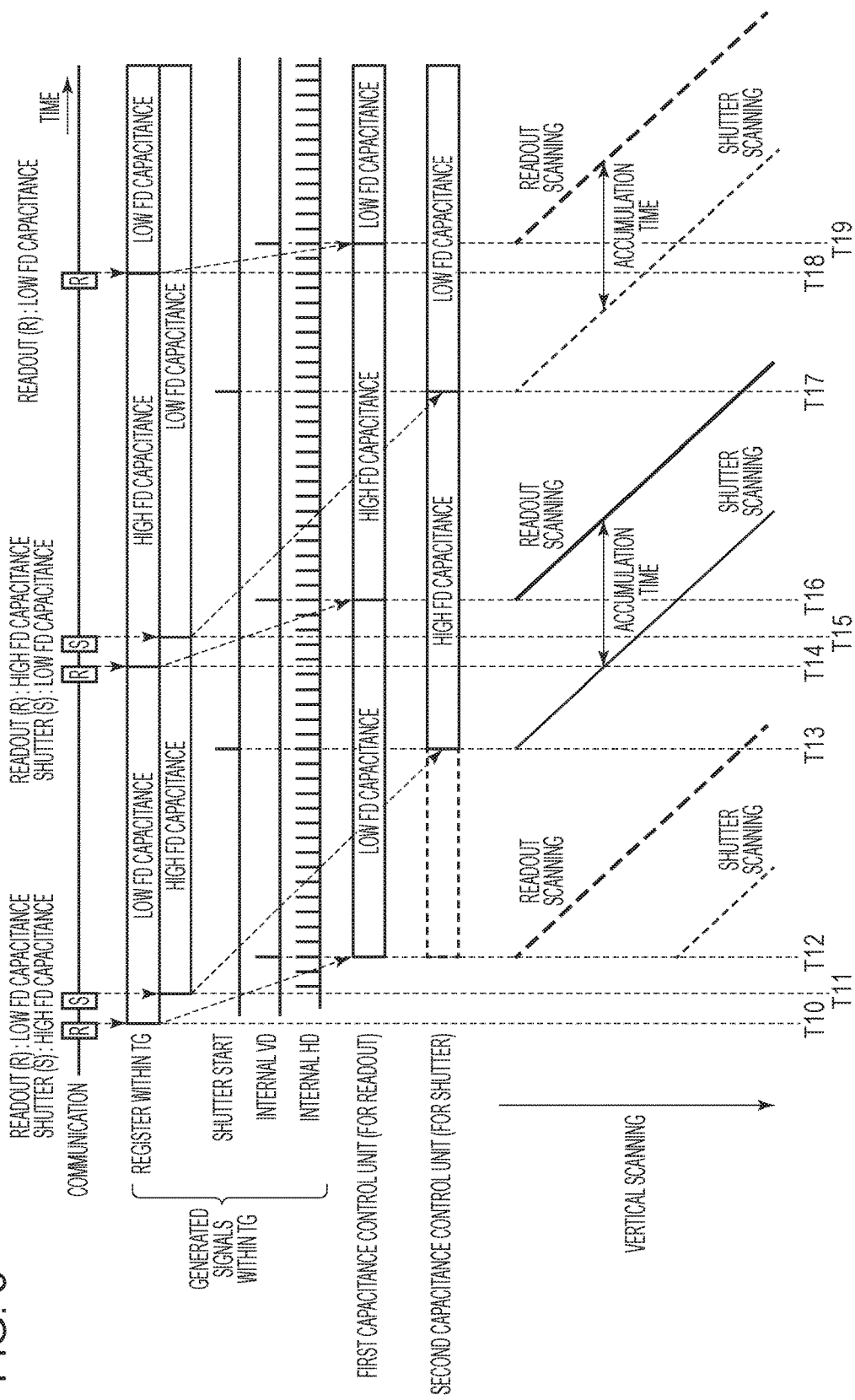
FIG. 3 schematically illustrates a driving method for the imaging apparatus according to the first exemplary embodiment.

FIG. 3 schematically illustrates a driving method for the imaging apparatus according to the first exemplary embodiment. FIG. 3 schematically illustrates operational timing of the imaging apparatus when the imaging apparatus is instructed to change the capacitance of the floating diffusions FD (FD capacitance) from an imaging system such as a camera. FIG. 3 illustrates operations to be performed when the imaging apparatus first receives a "Low FD capacitance" instruction, then receives a "High FD capacitance" instruction and receives a "Low FD capacitance" instruct again as an example. The operations in FIG. 3 are assumed to include operations repeating shutter scanning and readout scanning of moving image radiographing, for example.

When the FD capacitance is increased, an increased amount of electric charges can be accumulated though a lower gain is produced. Thus, settings can be acquired for imaging conditions with a higher quantity of incident light. On the other hand, when the FD capacitance is reduced, a higher gain can be produced though a lower amount of electric charges can be accumulated. Thus, settings can be acquired for imaging conditions with a lower quantity of incident light. The imaging system may instruct "Low FD capacitance" or "High FD capacitance" to the imaging apparatus on basis of an ISO sensitivity setting and predetermined conditions for a quantity of incident light from an object, for example.

At a time T10, the timing control unit 180 receives a signal instructing to perform readout scanning (R) with "Low FD capacitance". The signal is held in a register within the timing control unit 180 (TG). At a time T11, the timing control unit 180 receives a signal instructing shutter scanning (S) with "High FD capacitance". The signal is held in a register within the timing control unit 180 (TG).

At a time T12, the timing control unit 180 outputs a pulse signal (internal VD) triggering to start the readout scanning. The vertical scanning circuit 110 in response to the pulse starts the readout scanning. Here, the timing control unit 180 outputs at predetermined periods a pulse signal (internal HD) for determining scanning timing for each row. The vertical scanning circuit 110 moves to the next address of a readout row sequentially every time in response to the internal HD pulse. Thus, readout scanning from the top row to the final row is performed sequentially.

At the time T12, the timing control unit 180 also outputs the internal VD pulse to the first capacitance control unit 160. The first capacitance control unit 160 in response to it outputs a first output permission signal to the vertical scanning circuit 110. In this case, the first output permission signal is a signal at a low level indicating "Low FD capacitance" based on the signal in the register within the TG. The vertical scanning circuit 110 changes the control signal FDINC to a low level for pixels of the row subject to the readout operation on basis of the first output permission signal. Thus, the transistors M5 of the pixels 101 of the row have an OFF state while the readout operation is being performed, and the readout operation is performed with "Low FD capacitance". In other words, the first capacitance control unit 160 delays the output timing of the first output permission signal instructing an FD capacitance from the time T10 to the time T12 in synchronism with the timing when the vertical scanning circuit 110 starts the readout scanning.

At a time T13, the timing control unit 180 outputs a pulse signal (shutter start) triggering to start shutter scanning. The vertical scanning circuit 110 starts the shutter scanning in response to the pulse. The vertical scanning circuit 110 moves the address of the readout row by one sequentially every time in response to an internal HD pulse. Thus, the shutter scanning is sequentially performed from the top row to the final row.

At the time T13, the timing control unit 180 also outputs the pulse for starting a shutter operation to the second capacitance control unit 170. In response to the pulse, the second capacitance control unit 170 outputs a second output permission signal to the vertical scanning circuit 110. The second output permission signal is a signal at a high level indicating "High FD capacitance" based on the signal in the register within the TG. The vertical scanning circuit 110 changes the control signal FDINC to a high level for pixels of the row subject to the shutter operation on basis of the second output permission signal. Thus, the transistors M5 in the pixels 101 of the row have an ON state while the shutter operation is being performed, and the shutter operation is performed with "High FD capacitance" is performed. In other words, the second capacitance control unit 170 has a function to delay the output timing of the second output permission signal instructing an FD capacitance from the time T11 to the time T13 in synchronism with the timing when the vertical scanning circuit 110 starts the shutter scanning.

At a time T14, the timing control unit 180 receives a signal instructing to perform readout scanning (R) with "High FD capacitance". This signal is held in a register within the timing control unit 180 (TG). At a time T15, the timing control unit 180 receives a signal instructing shutter scanning (S) with "Low FD capacitance". This signal is held in a register within the timing control unit 180.

At a time T16, the readout scanning is started like the readout scanning started at the time T12. In the readout operation at the time T16, the first output permission signal indicates "High FD capacitance" on basis of the signal in the register within the TG. Thus, the readout scanning from the time T16 is performed with "High FD capacitance". FIG. 3 illustrates solid lines for shutter scanning and readout scanning indicating that the shutter scanning and readout scanning are performed with "High FD capacitance". FIG. 3 further illustrates broken lines indicating that corresponding shutter scanning and readout scanning are performed with "Low FD capacitance". The shutter scanning continues also after the time T16. In other words, a part of the shutter scanning and a part of the readout scanning can be performed in parallel during an identical time period.

As described above, the time period from the shutter operation to the readout operation corresponds to an accumulation time to the photoelectric converting unit PD. In other words, the shutter scanning started from the time T13 and the readout scanning started from the time T16 correspond to vertical scanning for acquiring an image of an identical frame. In this case, the shutter scanning and the readout scanning are both performed with "High FD capacitance". According to this exemplary embodiment, the first capacitance control unit instructs to change the FD capacitance for the readout scanning in synchronism with the start of the readout scanning, and the second capacitance control unit instructs to change the FD capacitance for shutter scanning in synchronism with the start of the shutter scanning. Thus, vertical scanning is performed such that the FD capacitance are not changed within a time period from the start to the end of the shutter scanning and readout scanning on all rows. For the shutter scanning and the readout scanning for acquiring an image of an identical frame, the FD capacitance settings therefor are matched. Thus, the vertical scanning is performed with an equal FD capacitance.

At a time T17, shutter scanning is started in the same manner as the shutter scanning started from the time T13. However, in the shutter scanning from the time T17, the second output permission signal indicates "Low FD capacitance" based on the signal in the register within the TG. Therefore, the shutter scanning from the time T17 is performed with "Low FD capacitance".

At a time T18, the timing control unit 180 receives a signal instructing readout scanning (R) with "Low FD capacitance". This signal is held in the register within the timing control unit 180. At a time T19, the readout scanning is started in the same manner as the readout scanning started from the times T12 and T16. However, in the readout scanning from the time T19, the first output permission signal indicates "Low FD capacitance" based on the signal in the register within the TG. Thus, the readout scanning from the time T19 is performed with "Low FD capacitance". The shutter scanning started from the time T17 and the readout scanning started from the time T19 correspond to vertical scanning on an identical frame, and both of the shutter scanning and the readout scanning are performed with "Low FD capacitance". In other words, in consideration of the relationship between the shutter scanning and the readout scanning vertical scanning with an identical FD capacitance setting is performed for the shutter scanning and readout scanning for acquiring an image of an identical frame.

Figure 4A:
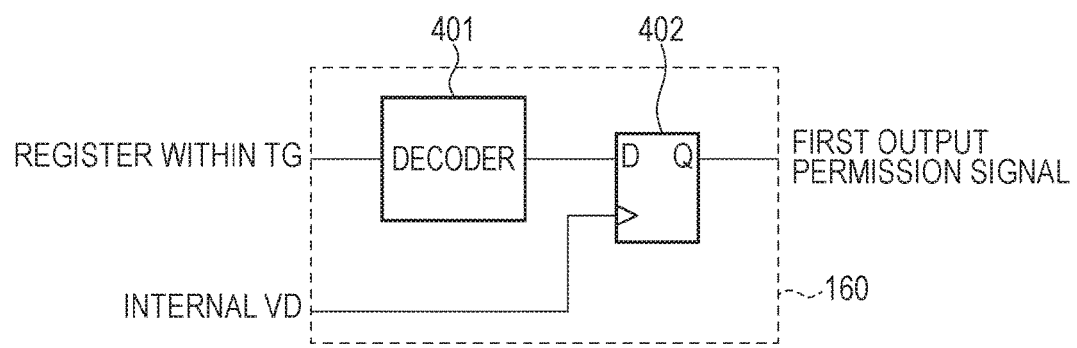
FIGS. 4A and 4B are block diagrams illustrating a configuration of a capacitance control unit according to the first exemplary embodiment.

Specific configuration examples of the first capacitance control unit 160, second capacitance control unit 170 and vertical scanning circuit 110 for implementing a driving method for the imaging apparatus illustrated in FIG. 3 will be described. FIG. 4A is a block diagram illustrating a configuration of the first capacitance control unit 160 according to the first exemplary embodiment. The first capacitance control unit 160 includes a decoder 401 and a D latch circuit 402. The first capacitance control unit 160 receives a signal indicating an FD capacitance setting held in an internal register of the timing control unit 180 (called a register within the TG) and a pulse signal from the internal VD from the timing control unit 180.

The decoder 401 decodes the signals held in the timing control unit 180. If the register value for a readout operation indicates "Low FD capacitance", the decoder 401 outputs 0 (low level). If the register value for a readout operation indicates "High FD capacitance", the decoder 401 outputs 1 (high level). The output signal from the decoder 401 is input to a data terminal D of the D latch circuit 402. A pulse signal from the internal VD is input to a clock terminal of the D latch circuit 402. The D latch circuit 402 has an output terminal Q being an output terminal of the first capacitance control unit 160 and outputs a first output permission signal to the vertical scanning circuit 110.

A signal indicating an FD capacitance setting output from the decoder 401 for output by the D latch circuit 402 is delayed until a time when a pulse of the internal VD is input, that is, a starting time of the readout scanning. The output signal is input to the vertical scanning circuit 110 as the first output permission signal.

Figure 4B:
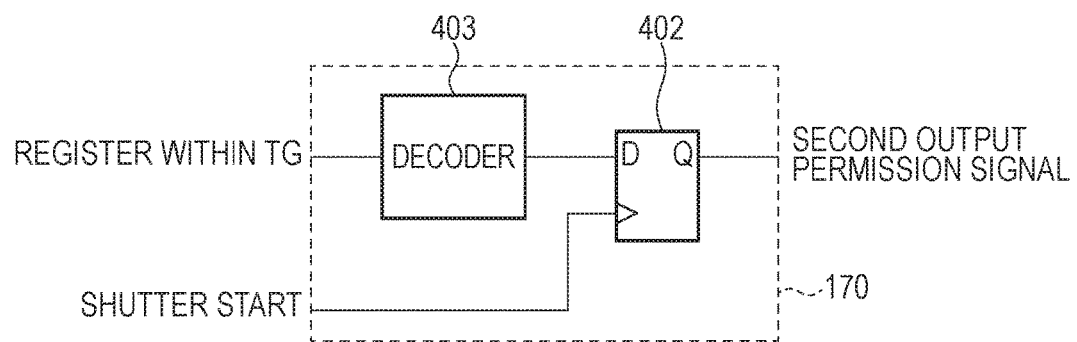

FIG. 4B is a block diagram illustrating a configuration of the second capacitance control unit 170 according to the first exemplary embodiment. The second capacitance control unit 170 includes a decoder 403 and a D latch circuit 402. Any repetitive descriptions regarding the first capacitance control unit 160 and the second capacitance control unit 170 will be omitted. The decoder 403 decodes a signal held in the timing control unit 180. If the register value for a shutter operation indicates "Low FD capacitance", the decoder 403 outputs 0 (low level). If the register value for a shutter operation indicates "High FD capacitance", the decoder 403 outputs 1 (high level). A signal indicating an FD capacitance setting output from the decoder 403 for output by the D latch circuit 402 is delayed until a time when a pulse for shutter start is input, that is, a starting time of the shutter scanning. The output signal is input to the vertical scanning circuit 110 as a second output permission signal. If the register value for a readout operation and a register value for a shutter operation in the timing control unit 180 are "High FD capacitance", 1 (high level) may be set. If they are "Low FD capacitance", 0 (low level) may be set. In this case, the decoder 401 in FIG. 4A and the decoder 403 in FIG. 4B can be omitted.

Figure 5:
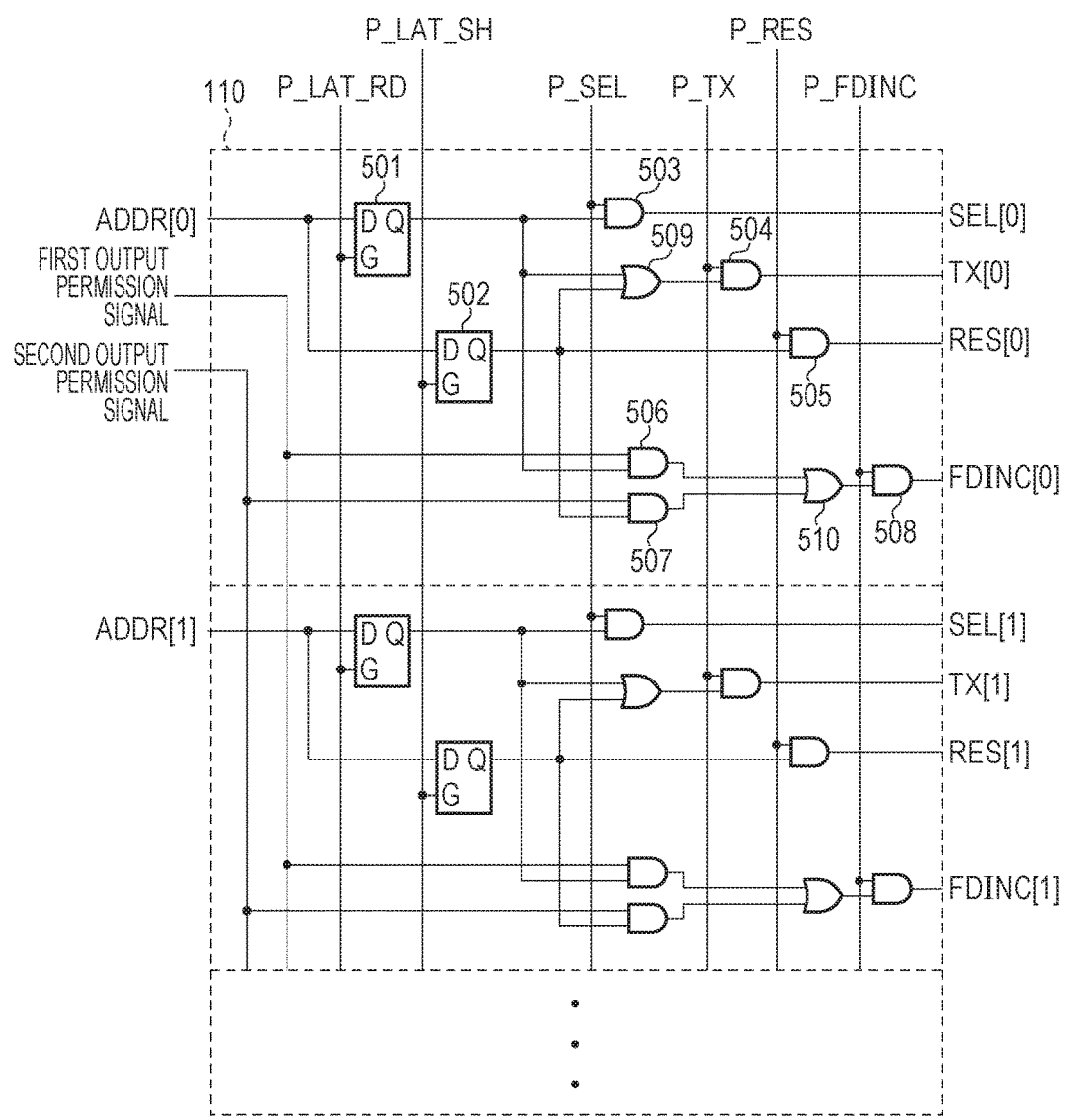
FIG. 5 is a circuit diagram illustrating a configuration of a vertical scanning circuit according to the first exemplary embodiment.

FIG. 5 is a circuit diagram illustrating a configuration of the vertical scanning circuit 110 according to the first exemplary embodiment. The vertical scanning circuit 110 is configured to sequentially generate control signals RES[0] to [n], TX[0] to [n], FDINC[0] to [n], SEL[0] to [n] row by row. Rows for generating those control signals are selected on basis of address signals ADDR[0] to [n] indicating decoded row addresses under control of the timing control unit 180. The address signals ADDR[0] to [n] have a high level (1) at selected rows and a low level (0) at non-selected rows. The vertical scanning circuit 110 receives the first output permission signal and the second output permission signal from the first capacitance control unit 160 and the second capacitance control unit 170, respectively. The vertical scanning circuit 110 further receives signals P_LAT_RD, P_LAT_SH, P_SEL, P_TX, P_RES, and P_FDINC from the timing control unit 180.

The vertical scanning circuit 110 has blocks each configured to generate a control signal for each row of the pixel array 100. The address signals ADDR[0] to [n] are input to blocks of the corresponding 0th row to the nth row. The first output permission signal, the second output permission signal, and the signals P_LAT_RD, P_LAT_SH, P_SEL, P_TX, P_RES, and P_FDINC are input to the blocks of the 0th row to the nth row of the vertical scanning circuit via a common signal line. The block of the 0th row will be described below which generates the control signals RES[0], TX[0], FDINC[0], and SEL[0] for the 0th row (top row).

The vertical scanning circuit 110 has D latch circuits 501 and 502, AND circuits 503, 504, 505, 506, 507, and 508, and OR circuits 509 and 510. The address signal ADDR[0] is input to the data terminal D of the D latch circuit 501 and the data terminal D of the D latch circuit 502. The D latch circuit 501 has a gate terminal G that receives the signal P_LAT_RD. The D latch circuit 502 has a gate terminal G that receives the signal P_LAT_SH. When the address signal ADDR[0] is changed to have a high level, the signal output from the output terminal Q of the D latch circuit 501 is changed to have a high level from a time when a pulse as the signal P_LAT_RD is input. The same is true for the D latch circuit 502.

The signals output from the output terminal Q of the D latch circuit 501 are input to one of two input terminals of each of the AND circuits 503 and 506 and the OR circuit 509. The other input terminal of the AND circuit 503 receives a signal P_SEL. The AND circuit 503 outputs a logical product of the output of the D latch circuit 501 and the signal P_SEL to the pixels 101 of the 0th row as a control signal SEL[0].

The signals output from the output terminal Q of the D latch circuit 502 are input to one of two input terminals of each of the AND circuits 505 and 507 and the other input terminal of the OR circuit 509. The OR circuit 509 outputs a logical sum of the output of the D latch circuit 501 and the output of the D latch circuit 502 to one of two input terminals of the AND circuit 504. The AND circuit 504 has the other input terminal that receives a signal P_TX. The AND circuit 504 outputs a logical product of the output of the OR circuit 509 and the signal P_TX as the control signal TX[0] to the pixels 101 of the 0th row. The AND circuit 505 has the other input terminal that receives a signal P_RES. The AND circuit 505 outputs a logical product of the output of the D latch circuit 502 and the signal P_RES to the pixels 101 of the 0th row as a control signal RES[0].

The AND circuit 506 has the other input terminal that receives the first output permission signal. The AND circuit 506 outputs a logical product of the output of the D latch circuit 501 and the first output permission signal to one of two input terminals of the OR circuit 510. The AND circuit 507 has the other input terminal that receives the second output permission signal. The AND circuit 507 outputs a logical product of the output of the D latch circuit 502 and the second output permission signal to the other input terminal of the OR circuit 510. The OR circuit 510 outputs a logical sum of the output of the AND circuit 506 and the output of the AND circuit 507 to one of two input terminals of the AND circuit 508. The AND circuit 508 has the other input terminal that receives a signal P_FDINC. The AND circuit 508 outputs a logical product of the output of the OR circuit 510 and the signal P_FDINC to the pixels 101 of the 0th row as a control signal FDINC[0].

The blocks from the first row to the nth row of the vertical scanning circuit 110 have the same configuration. In the description of the configuration of the blocks from the first row to the nth row, the index [0] given to the signals in the description above is replaced by [1] to [n]. Each of the output terminals configured to output the control signals may have a buffer circuit, not illustrated.

Figure 6:
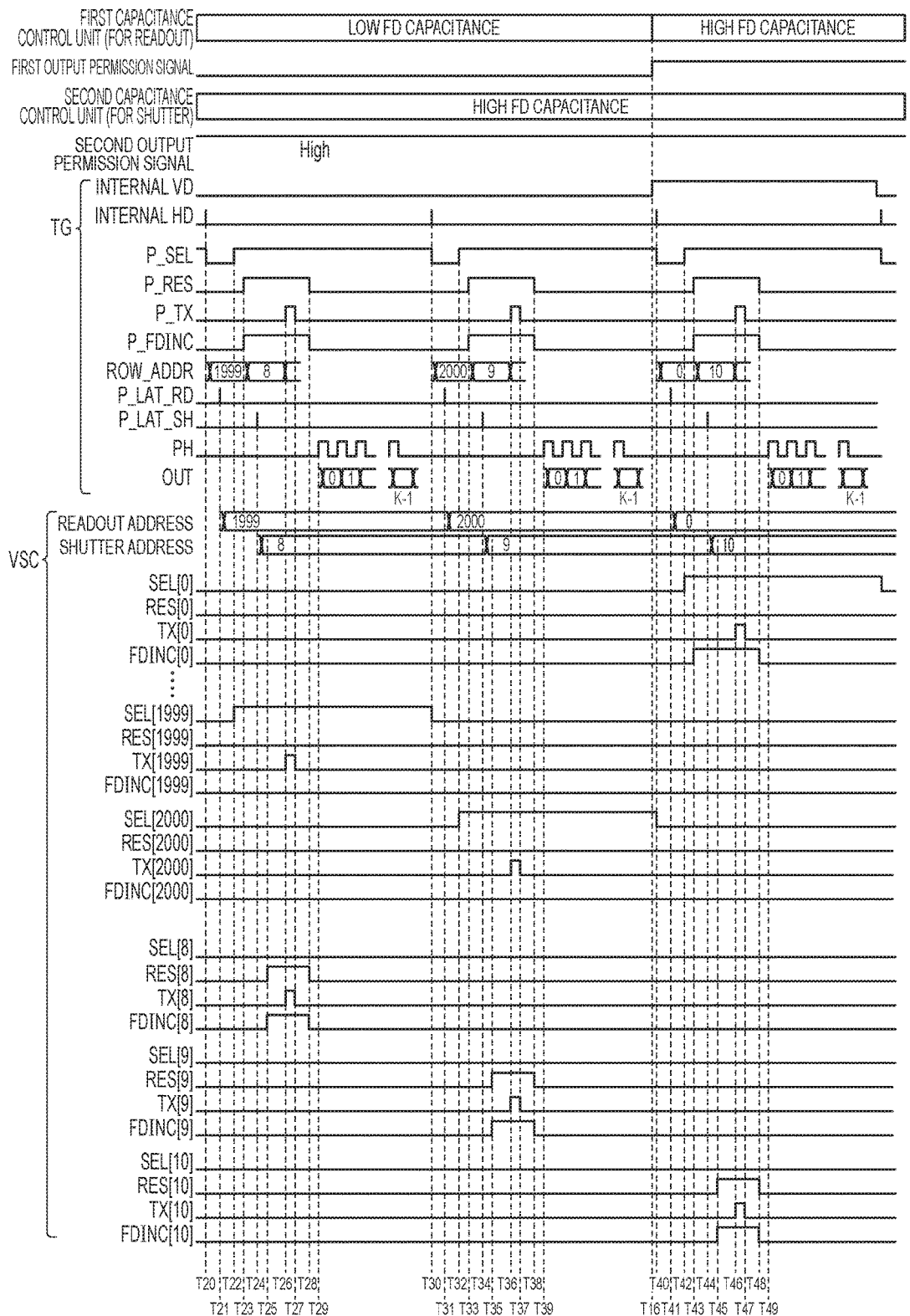
FIG. 6 is an operational timing chart for the imaging apparatus according to the first exemplary embodiment.

Next, output timing for the control signals generated by the vertical scanning circuit 110 will be described more specifically with reference to FIG. 6 to describe more specific operations of the imaging apparatus. FIG. 6 is a timing chart for signals input/output to/from the vertical scanning circuit 110, first capacitance control unit 160, second capacitance control unit 170, and timing control unit 180 during a vertical scanning period for three rows around the time T16 in FIG. 3. The following description assumes that the value of n is equal to 2000, that is, the number of rows of the pixel array 100 is equal to 2001.

The first output permission signal and the second output permission signal are output signals from the first capacitance control unit 160 and the second capacitance control unit 170, respectively, as described above. The signals internal VD, internal HD, P_SEL, P_RES, P_TX, P_FDINC, ROW_ADDR, P_LAT_RD, P_LAT_SH, and PH are output from the timing control unit 180. The signal OUT is output from the output terminal OUT of the imaging apparatus. FIG. 6 further illustrates timing of the control signals SEL, RES, TX, and FDINC at the 0th row, the 1999th row, the 2000th row, the eighth row, the ninth row, and the tenth row. Readout scanning is to be performed on the 0th row, the 1999th row, and the 2000th, and shutter scanning is to be performed on the eighth row, the ninth row, and the tenth row.

Here, the signal ROW_ADDR indicates a row address on which a readout operation and a shutter operation are performed. For example, at a time T21, because the row address indicated by the signal ROW_ADDR is 1999, the address signal ADDR[1999] is changed to have a high level.

Next, with reference to FIG. 6, operations of the imaging apparatus will be sequentially described along a time course. At a time T20, in synchronism with a pulse of the internal HD, the row address indicated by the signal ROW_ADDR is started to shift to 1999. At the same time, the signal P_SEL is changed from a high level to a low level. At a time T21, the timing control unit 180 outputs a pulse of the signal P_LAT_RD to the vertical scanning circuit 110. The pulse is input to the gate terminal G of the D latch circuit 501. At that time, because the address signal ADDR[1999] has a high level, the outputs of the D latch circuit 501 of the 1999th row is changed to a high level. In other words, the readout address is started to shift to the 1999th row.

At a time T22, the signal P_SEL is changed to a high level. Thus, the output of the AND circuit 503 at the 1999th row, that is, the control signal SEL[0076] is changed to a high level. Thus, the selection transistor M4 of the each of the pixels 101 of the 1999th row is turned on, and a readout operation is enabled from the pixels 101 of the 1999th row.

At a time T23, the signals P_RES and P_FDINC are changed to a high level. At this time point, because the output of the D latch circuit 502 of each row has a low level, the output of the AND circuit 505, that is, the control signal RES keeps its low level. Further at the time point, because "Low FD capacitance" is set for the first capacitance control unit, the first output permission signal has a low level, and the control signal FDINC also keeps its low level. At the time T23, the row address of the signal ROW_ADDR is started to shift to 8.

At a time T24, the timing control unit 180 outputs a pulse of the signal P_LAT_SH to the vertical scanning circuit 110. The pulse is input to the gate terminal G of the D latch circuit 502. At a time T25, because the address signal ADDR[8] has a high level, the output of the D latch circuit 502 of the eighth row is changed to a high level, and the shutter address is shifted to the eighth row. Thus, the outputs of the AND circuits 505 and 508 of the eighth row are changed to a high level. In other words, the control signals RES[8] and FDINC[8] are changed to a high level. This operation turns on the reset transistor M2 of each of the pixels 101 of the eighth row. The transistor M5 of each of the pixels 101 of the eighth row is turned on, and the additional capacitor Cinc is connected to the floating diffusion FD and is shifted to "High FD capacitance".

At a time T26, the signal P_TX is changed to a high level. Thus, the output of the AND circuit 504 of the eighth row and the output of the AND circuit 504 of the 1999th row, that is, the control signals TX[8] and TX[1999] are changed to a high level. This operation turns on the transfer transistor M1 of each of the pixels 101 of the eighth row. At that time, because the transfer transistors M1 and the reset transistors M2 of the eighth row are turned on, electric charges of the photoelectric converting unit PD and floating diffusion FD of each of the pixels 101 of the eighth row are reset. In other words, a shutter operation is performed on each of the pixels 101 of the eighth row. Furthermore, the transfer transistor M1 of each of the pixels 101 of the 1999th row is turned on. The electric charges accumulated in the photoelectric converting unit PD of each of the pixels 101 of the 1999th row are transferred to the floating diffusion FD. The signals from the pixels 101 of the 1999th row are read out by the column readout unit 120 and are held in the memory unit 130. In other words, the readout operation is performed on the pixels 101 of the 1999th row.

At a time T27, the signal P_TX is changed to a low level, and the transfer transistor M1 of each of the pixels 101 of the eighth row and 1999th row is turned off. At a time T28, the signals P_RES and P_FDINC are changed to a low level. Thus, the reset transistor M2 of each of the pixels 101 of the eighth row and 1999th row is turned off, and the transistors M5 of the eighth row are turned off.

At a time T29, the timing control unit 180 outputs a pulse of the signal PH to the horizontal scanning circuit 150. In accordance with the signal PH, the signal holding units 131 in the memory unit 130 are sequentially selected. The signals output from the pixels 101 of the 1999th row held in the memory unit 130 are sequentially output to the output terminal OUT. Thus, in the time period from the time T20 to the time T29, the readout operation on the 1999th row and the shutter operation on the eighth row are performed.

In a time period from a time T30 to a time T39, a readout operation is performed on the 2000th row, and a shutter operation is performed on the ninth row. Because details of the operations at the corresponding times are the same except for the row number, any repetitive descriptions will be omitted. Because the 2000th row is the final row, the readout operation thereon corresponds to readout of the final row of the frame.

At the time T16, in response to a rise of a pulse of the internal VD, the imaging apparatus shifts to an imaging operation on the next frame. In response thereto, the first output permission signal output from the first capacitance control unit to the vertical scanning circuit 110 is changed to a high level.

In a time period from a time T40 to a time T42, the same operations are performed as in the time period from the time T20 to the time T22. At a time T43, signals P_RES and P_FDINC are changed to a high level. At that time, unlike the states at the time T23, because the first capacitance control unit is set at "High FD capacitance", the first output permission signal has a high level. Thus, the control signal FDINC[0] is changed to a high level so that the transistors M5 are turned ON. This operation connects the additional capacitor Cinc to the floating diffusion FD so that the "High FD capacitance" state can be acquired.

The operations in the subsequent period from a time T44 to a time T47 are the same as those in the period from the time T24 to the time T27. The readout operation performed on the pixels 101 of the 0th row is different from the readout operations on the 1999th row and the 2000th row in that it is performed with "High FD capacitance". At a time T48, the signals P_RES and P_FDINC are changed to a low level, and the reset transistor M2 and transistor M5 of each of the pixels 101 of the 0th row and 1 the 0th row are turned off.

The imaging apparatus according to this exemplary embodiment has, as described above, the first capacitance control unit 160 configured to output the first output permission signal corresponding to shutter scanning and the second capacitance control unit 170 configured to output the second output permission signal corresponding to readout scanning. The transistors M5 each configured to connect or disconnect between the additional capacitor Cinc and the floating diffusion FD are controlled by the control signals FDINC[0] to [n] generated based on the first output permission signal and the second output permission signal. In other words, two control units of a control unit corresponding to the shutter scanning and a control unit corresponding to the readout operation may be operated separately. Thus, according to this exemplary embodiment, the imaging apparatus can be provided in which the capacitance value of the floating diffusion can be controlled.

Figure 7:
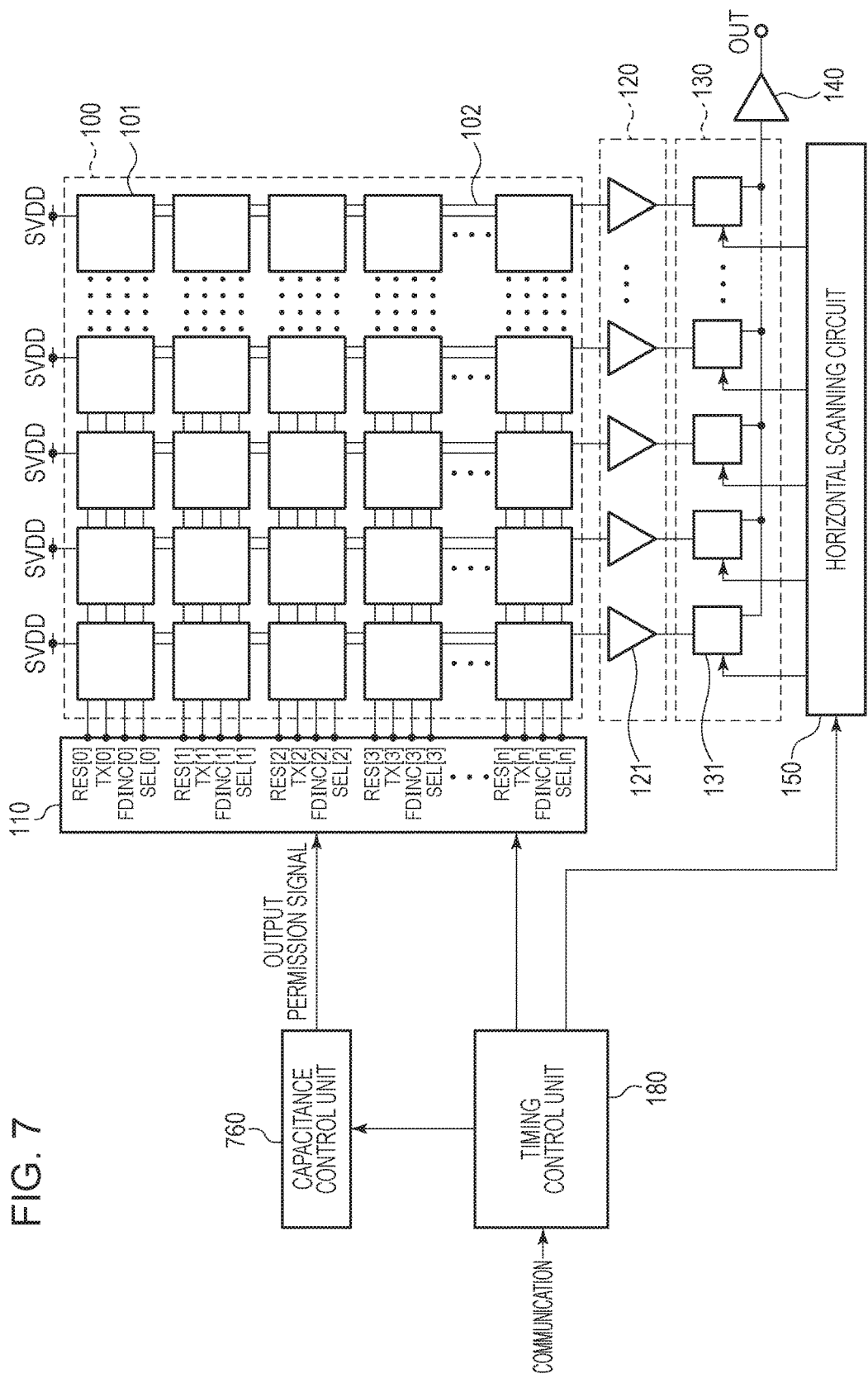
FIG. 7 is a block diagram illustrating a configuration of the imaging apparatus according to a comparison example.

With reference to FIG. 7 to FIGS. 9A and 9B, a comparison example to this exemplary embodiment will be described. The comparison example and the first exemplary embodiment are compared to describe details of effects of the first exemplary embodiment. FIG. 7 is a block diagram illustrating a configuration of an imaging apparatus according to the comparison example. The imaging apparatus of the comparison example has a capacitance control unit 760 instead of the first capacitance control unit 160 and second capacitance control unit 170 of the first exemplary embodiment. In other words, the imaging apparatus of the comparison example has one capacitance control unit configured to output one output permission signal.

Figure 8:
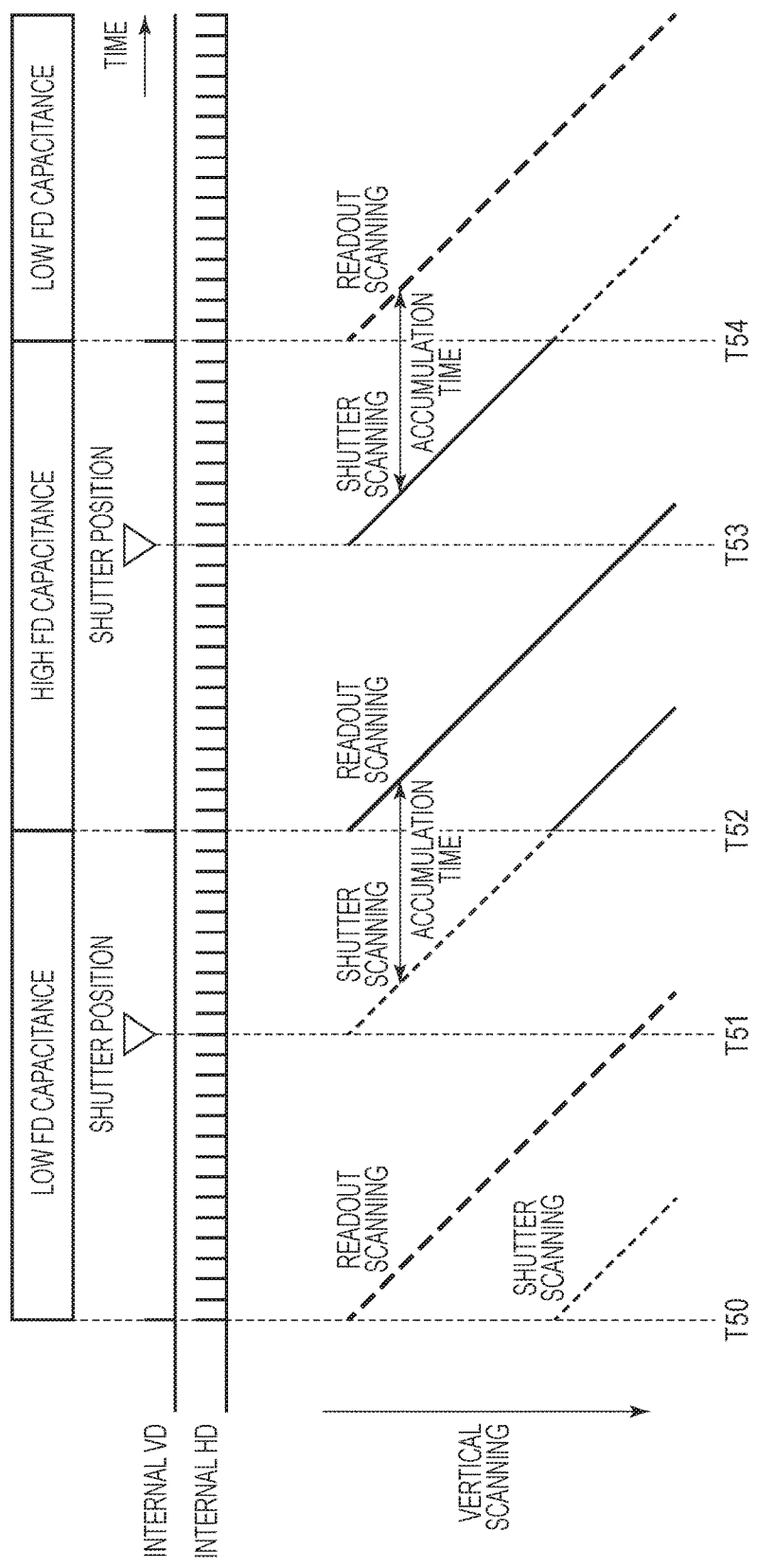
FIG. 8 schematically illustrates a driving method for the imaging apparatus according to the comparison example.

FIG. 8 schematically illustrates a driving method for the imaging apparatus according to the comparison example. In a case where one capacitance control unit is provided, an FD capacitance setting is common to shutter scanning and readout scanning. In this case, because the FD capacitance setting cannot be changed during a readout scanning time period for imaging for one frame, the FD capacitance setting is changed between frames, such as immediately before a readout operation on a top row. In the example in FIG. 8, "Low FD capacitance" is acquired in a time period from a time T50 to a time T52 and a time period from a time T54, and "High FD capacitance" is acquired in a time period from the time T52 to the time T54. In other words, "Low FD capacitance" is shifted to "High FD capacitance" at the time T52, and "High FD capacitance" is shifted to "Low FD capacitance" at the time T54.

Shutter scanning to be started from the time T53 (shutter position) will be described below. With some settings for accumulation times, shutter scanning and readout scanning may be performed partially in parallel in an identical time period, as illustrated in FIG. 8. In this case, the FD capacitance at the time T54 is shifted in the middle of shutter scanning, and the shutter scanning is performed with different FD capacitance settings before and after the time T54. This may cause noise near a row on which a shutter operation is performed at the time T54, which may degenerate image quality.

Figure 9A:
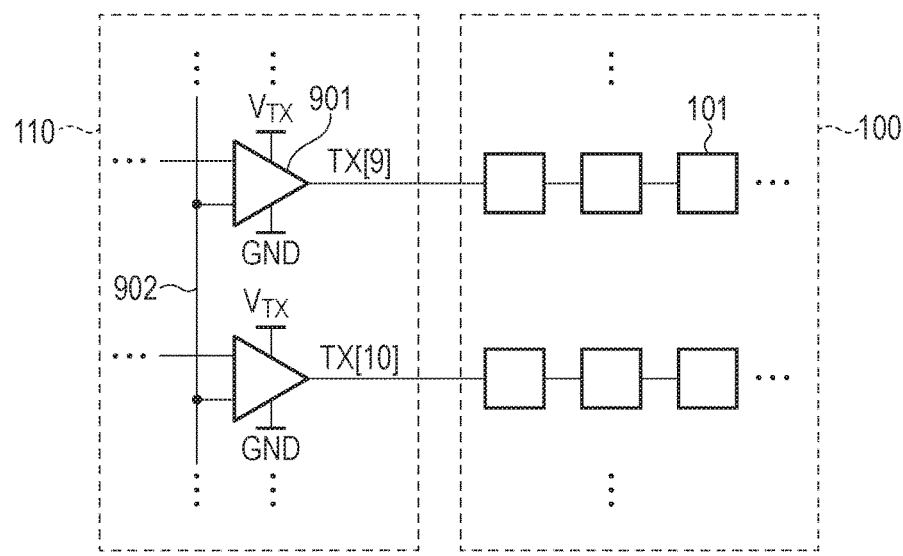
FIGS. 9A and 9B illustrate noise generation factors in the imaging apparatus according to the comparison example.

An example of the cause of the noise will be described with reference to FIGS. 9A and 9B. FIG. 9A illustrates an amplifier 901 configured to output control signals TX[9] and TX[10] in the vertical scanning circuit 110 and a peripheral circuit arrangement. The amplifier 901 is provided for each row of the pixels 101. FIG. 9A only illustrates the amplifier 901 corresponding to the ninth and tenth rows and does not illustrate the other rows. The amplifier 901 is provided in an output stage of the vertical scanning circuit 110 and functions as a buffer circuit configured to supply a control signal TX to the pixels 101. The amplifier 901 has a power supply terminal that receives a power supply voltage $V_{TX}$. The amplifier 901 has two input terminals one of which is connected to an output terminal of the logic circuit as illustrated in FIG. 5, for example. The other input terminal of the amplifier 901 is connected to a reference voltage line 902. The reference voltage line 902 is connected commonly to the amplifiers 901 of rows.

Figure 9B:
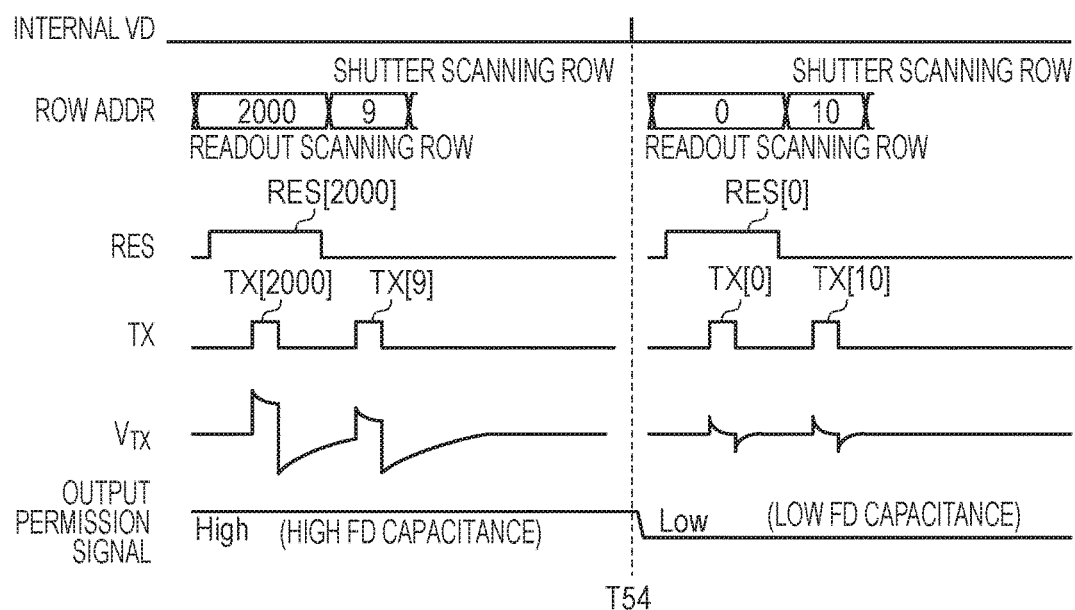

FIG. 9B is a timing chart for time periods before and after the time T54. In the time period before the time T54, a readout operation is performed on the 2000th row, and a shutter operation is performed on the ninth row. In the time period after the time T54, a readout operation is performed on the 0th row, and a shutter operation is performed on the tenth row. Because, as described above, "High FD capacitance" is shifted to "Low FD capacitance" at the time T54, the floating diffusion FD has different capacitances between the time point when the control signal TX[9] is input and the time point when the control signal TX[10] is input.

FIG. 9B illustrates a $V_{TX}$ graph illustrating time variations in power supply voltage $V_{TX}$ supplied to the power supply terminal of the amplifier 901. When the control signals TX[9] and TX[10] are input to the transfer transistor M1, a variation in voltage of these control signal changes the power supply voltage $V_{TX}$. An amount of variation of the power supply voltage $V_{TX}$ when the control signal TX[9] is input is different from a variation amount of the power supply voltage $V_{TX}$ when the control signal TX[10] is input. This is due to an influence of a different in capacitance of the floating diffusion FD. A variation in power supply voltage $V_{TX}$ has an influence on operations of the amplifier 901 at the adjacent row through the reference voltage line 902 and may have an influence such as a waveform variation on the control signal TX of the adjacent row. When the variation amount in power supply voltage $V_{TX}$ changes rapidly near a certain row, the amount of a waveform variation may rapidly changes, which may have an influence on image quality. Thus, image quality may degraded near the row on which a shutter operation is performed, that is, near the ninth row and the tenth row in the time periods before and after the time T54. In a case where a region near the ninth row and the tenth row is an OB (Optical Black) pixel region, which will be described below, a deviation of the reference level may degrade the image quality.

On the other hand, according to the first exemplary embodiment, as illustrated in FIG. 3, the second capacitance control unit 170 delays the output of the second output permission signal such that the capacitance of the floating diffusion FD can change in synchronism with the start of shutter scanning. Thus, it can be controlled to prevent the capacitance setting for the floating diffusion FD from being changed during a shutter scanning operation. Therefore, according to the first exemplary embodiment, image quality degradation which may be caused in the comparison example can be reduced.

Second Exemplary Embodiment

Figure 10:
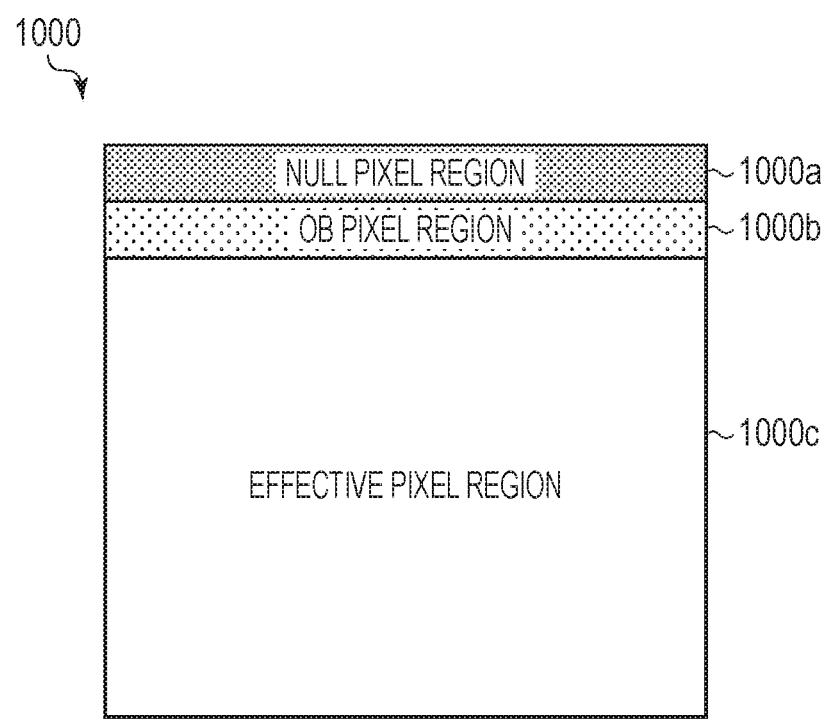
FIG. 10 illustrates an arrangement of a pixel array according to a second exemplary embodiment.

FIG. 10 illustrates an arrangement of a pixel array according to a second exemplary embodiment. A pixel array 1000 has a NULL pixel region 1000a having NULL pixels (dummy pixels), an OB pixel region 1000b having OB pixels (light shielded pixels), and an effective pixel region 1000c having the pixels 101 (effective pixels) according to the first exemplary embodiment. The NULL pixel region 1000a, the OB pixel region 1000b, and the effective pixel region 1000c are arranged in order from the top row of the pixel array 1000. A NULL pixel is a pixel not having a photoelectric converting unit PD, and a reference signal not containing an influence of dark current can be acquired from the NULL pixel. An OB pixel is a pixel covered by a light shielding film of metal, for example, in which a photoelectric converting unit PD does not allow visible light to pass through, and a reference signal containing an influence of dark current can be acquired from the OB pixel. These reference signals may be used to correct signals acquired from the effective pixel region 1000c so that highly accurate imaging can be performed.

Figure 11:
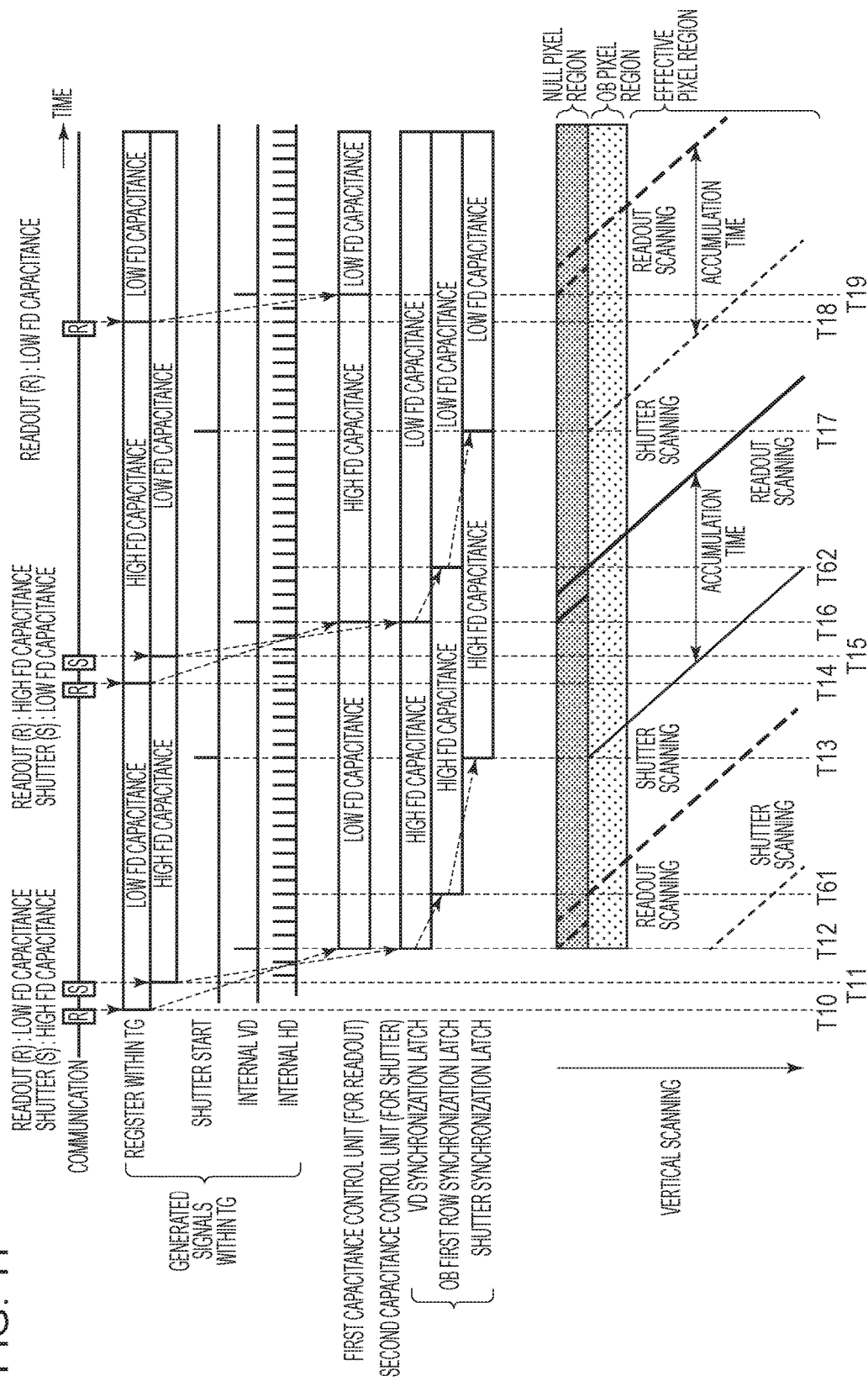
FIG. 11 schematically illustrates a driving method for an imaging apparatus according to the second exemplary embodiment.

FIG. 11 schematically illustrates a driving method for the imaging apparatus according to the second exemplary embodiment. The driving method according to this exemplary embodiment is different from the driving method according to the first exemplary embodiment in that vertical scanning is performed in consideration of the NULL pixel region 1000a and the OB pixel region 1000b and are also different in configurations and operations of the second capacitance control unit.

First, a vertical scanning method according to this exemplary embodiment will be described. Any repetitive descriptions regarding the first and second exemplary embodiments will be omitted. At a time T12, readout scanning is started in response to an pulse of the internal VD. Because the top row subject to readout scanning is in the NULL pixel region 1000a, readout scanning is performed on the NULL pixel region 1000a in a time period from the time T12 to a time T61. The readout scanning is performed twice on the NULL pixel region 1000a. The readout scanning may be performed once or three or more number of times. The reason why readout scanning is performed on the NULL pixel region 1000a a plurality of number of times is that signals acquired by a plurality of scanning operations may be averaged for higher accuracy.

At the time T61, the readout scanning on the NULL pixel region 1000a ends, and readout scanning on the OB pixel region is started. When readout scanning on all rows of the OB pixel region ends, the readout scanning on the effective pixel region is started continuously. At a time T13, shutter scanning is started. The shutter scanning is not performed on the NULL pixel region 1000a but is started from the OB pixel region 1000b. This is because the NULL pixel region 1000a does not have a photoelectric converting unit PD.

Figure 12:
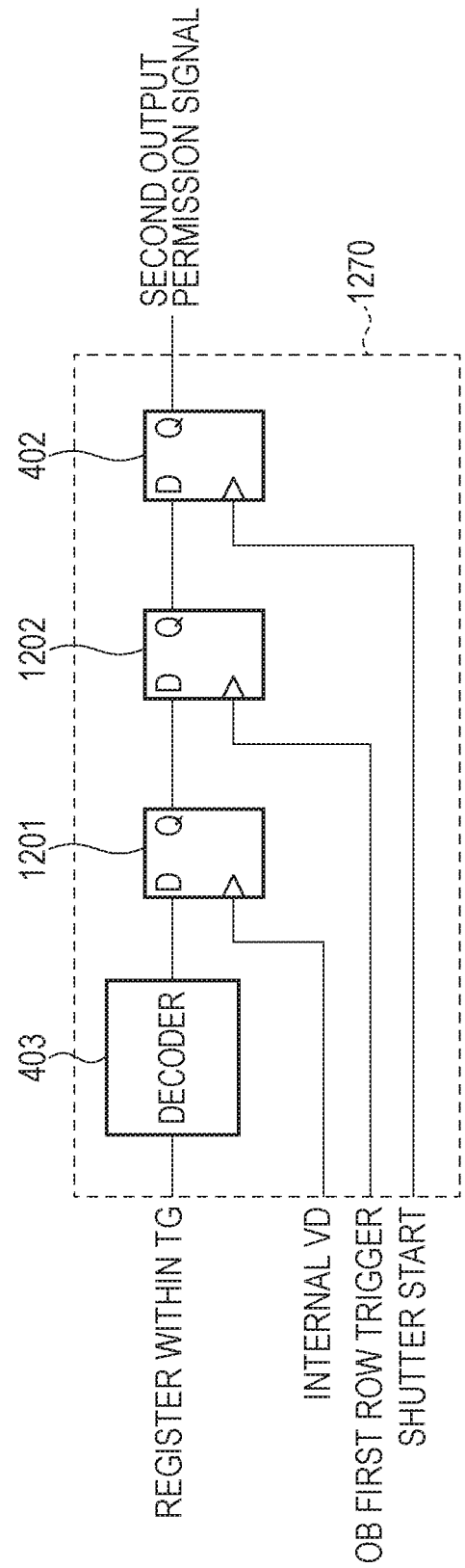
FIG. 12 is a block diagram illustrating a configuration of a capacitance control unit according to the second exemplary embodiment.

Next, a configuration of a second capacitance control unit 1270 according to this exemplary embodiment will be described. FIG. 12 is a block diagram illustrating a configuration of the second capacitance control unit 1270 according to the second exemplary embodiment. The second capacitance control unit 1270 includes a decoder 403 and D latch circuits 1201, 1202, and 402. In other words, the second capacitance control unit 1270 further includes the D latch circuit 1201 having a clock terminal that receives a pulse signal of the internal VD and the D latch circuit 1202 having a clock terminal that receives pulse signal triggering the top row of the OB pixel region 1000b.

Operations of the second capacitance control unit 1270 relating to shutter scanning according to this exemplary embodiment will be described with reference to operations of the second capacitance control unit in FIG. 11 and to FIG. 12. At a time T11, like the first exemplary embodiment, a high level signal indicating "High FD capacitance" is input from the decoder 403 to a data terminal D of the D latch circuit 1201. At the time T12, a pulse signal of the internal VD is input to the clock terminal of the D latch circuit 1201, and a high level signal indicating "High FD capacitance" is output from the output terminal Q of the D latch circuit 1201 to the data terminal D of the D latch circuit 1202. At the time T61, a pulse signal indicating the OB top row is input to the clock terminal of the D latch circuit 1202, and a high level signal indicating "High FD capacitance" is output from the output terminal Q of the D latch circuit 1202 to the data terminal D of the D latch circuit 402. After that, at the time T13, like the first exemplary embodiment, the second output permission signal is output from the D latch circuit 402 in response to a pulse for a shutter start.

The second capacitance control unit 1270 of this exemplary embodiment as described above has D latch circuits that are synchronized sequentially with a start of readout scanning, a start of readout of the top row of the OB pixel region 1000b, and a shutter start signal. In other words, the output timing of the second output permission signal is delayed to be in synchronism with a start of shutter scanning after the readout scanning on the NULL pixel region 1000a is started and the readout scanning on the OB pixel region 1000b is started. The shutter start signal may be input immediately after a communication for changing the FD capacitance because the communication is not in synchronism. If the interval is excessively short, processing relating to the FD capacitance change, for example may become difficult. According to this exemplary embodiment, because the second output permission signal relating to the FD capacitance change is output in synchronism with the shutter start signal after the start of readout scanning and the start of reading of the OB top row, a time period acquired from receipt of the communication for the FD capacitance change. Thus, the disadvantageous influence as described above can be reduced.

The layout of the latch circuit of the second capacitance control unit 1270 and the type of the triggering signal may be changed in accordance with the pixel configuration. For example, in a case where the NULL pixel region 1000a and the OB pixel region 1000b are arranged in a reversed layout, a pulse signal indicating the top row of the NULL pixel region may be input to the clock terminal of the D latch circuit 1202.

Third Exemplary Embodiment

Figure 13:
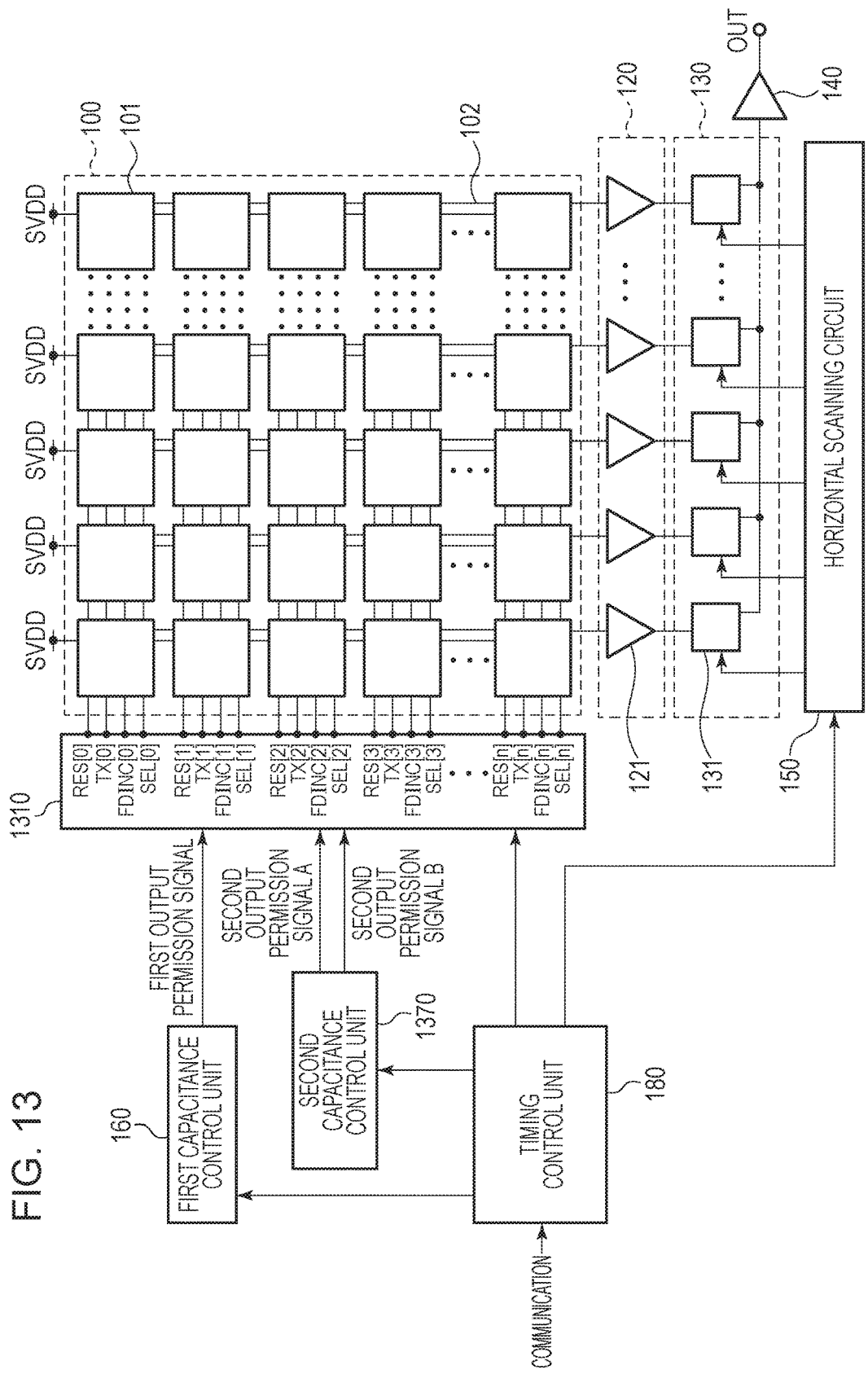
FIG. 13 is a block diagram illustrating a configuration of an imaging apparatus according to a third exemplary embodiment.

FIG. 13 is a block diagram illustrating a configuration of an imaging apparatus according to a third exemplary embodiment. This exemplary embodiment is different. From the first and second exemplary embodiments in configurations of a second capacitance control unit 1370 and a vertical scanning circuit 1310. The second capacitance control unit 1370 outputs two signals of a second output permission signal A and a second output permission signal B to the vertical scanning circuit 1310.

Figure 14:
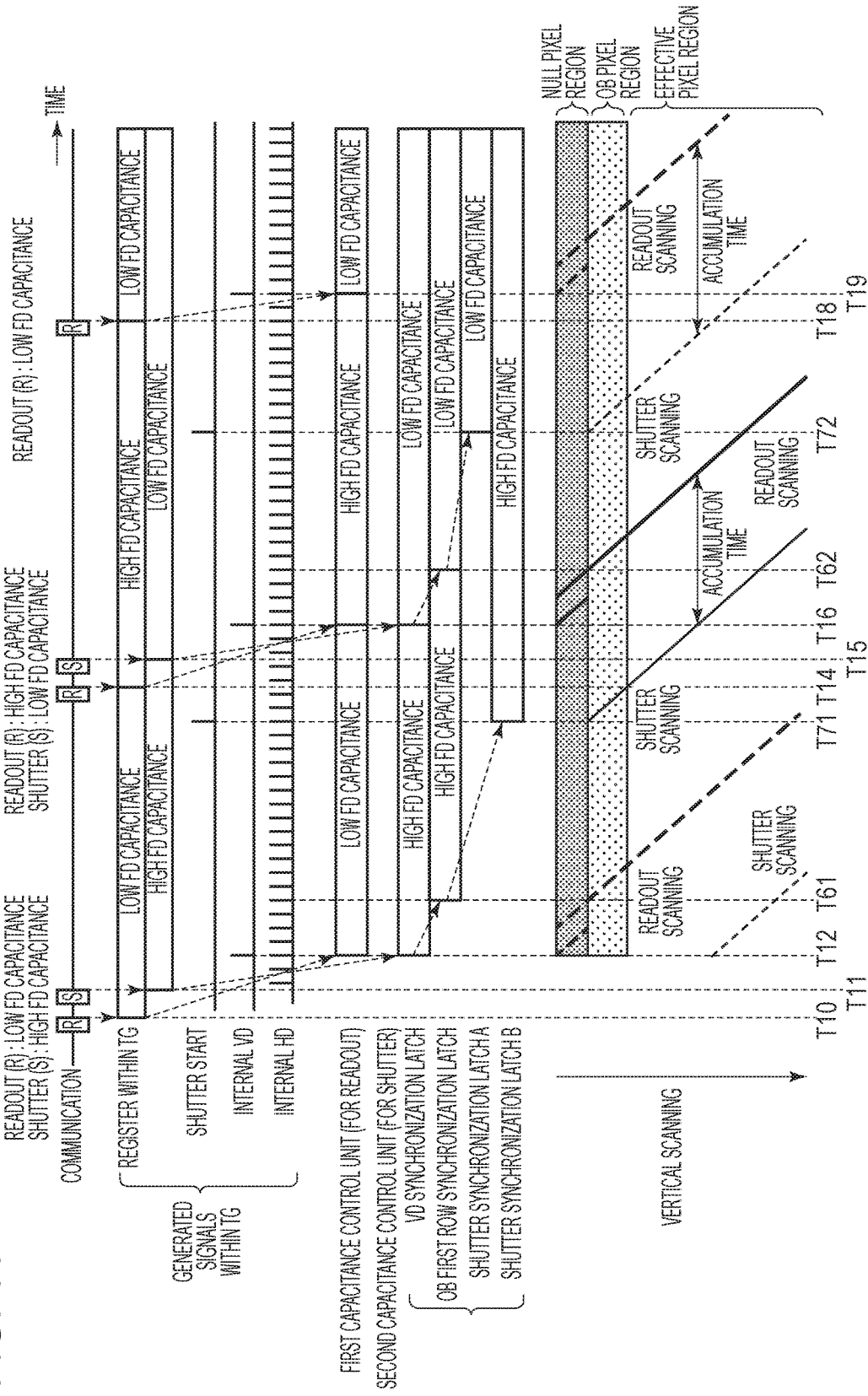
FIG. 14 schematically illustrates a driving method for the imaging apparatus according to the third exemplary embodiment.

FIG. 14 schematically illustrates a driving method for the imaging apparatus according to the third exemplary embodiment. In the imaging apparatus according to this exemplary embodiment, the second output permission signal A and the second output permission signal B are alternately enabled every pulse of the internal VD (or every frame). For the shutter scanning to be started at a time T71, the FD capacitance control is performed on basis of the second output permission signal B ("SHUTTER SYNCHRONIZATION LATCH B" in FIG. 14). For the shutter scanning to be started at a time T72, which is shutter scanning for the next frame, the FD capacitance control is performed on basis of the second output permission signal A ("SHUTTER SYNCHRONIZATION LATCH A" in FIG. 14). Configurations of the second capacitance control unit 1370 and vertical scanning circuit 1310 implementing the operations above will be described below.

Figure 15:
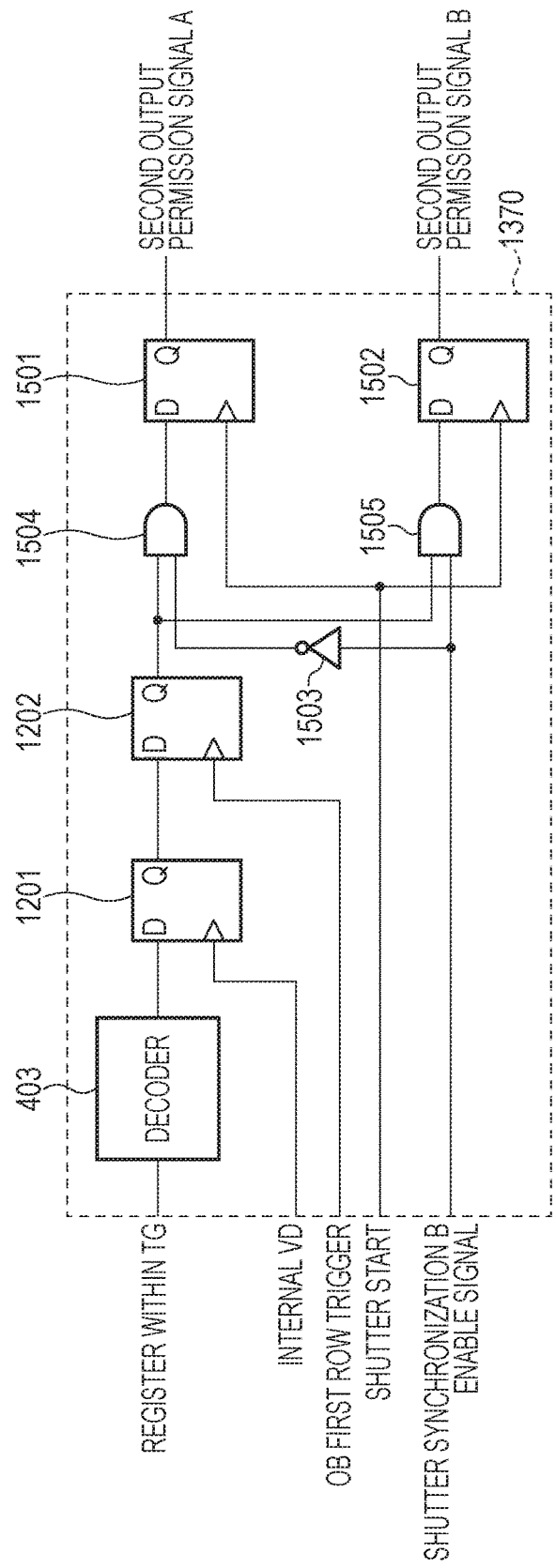
FIG. 15 is a block diagram illustrating a configuration of a capacitance control unit according to the third exemplary embodiment.

FIG. 15 is a block diagram illustrating a configuration of the second capacitance control unit 1370 according to the third exemplary embodiment. The second capacitance control unit 1370 has D latch circuits 1501 and 1502, a NOT circuit 1503 and AND circuits 1504 and 1505 instead of the D latch circuit 402 in the second capacitance control unit 1270 according to the second exemplary embodiment. Differences from the second capacitance control unit 1270 according to the second exemplary embodiment will be described below.

A signal output from the output terminal Q of the D latch circuit 1202 is input to one of two input terminals of the AND circuit 1504 and one of two input terminals of the AND circuit 1505. The other input terminal of the AND circuit 1505 receives a shutter synchronization B enable signal input from the timing control unit 180. The shutter synchronization B enable signal is a signal repeating a high level and a low level alternately every pulse of the internal VD. The other input terminal of the AND circuit 1504 receives the shutter synchronization B enable signal through the NOT circuit 1503. An output signal from the AND circuit 1504 is input to the data terminal D of the D latch circuit 1501. An output signal from the AND circuit 1505 is input to the data terminal D of the D latch circuit 1502. Each of the D latch circuits 1501 and 1502 has a clock terminal that receives a pulse signal for a shutter start. The second output permission signal A is output from the output terminal Q of the D latch circuit 1501, and the second output permission signal B is output from the output terminal Q of the D latch circuit 1502.

In the second capacitance control unit 1370 according to the third exemplary embodiment, when the shutter synchronization B enable signal has a high level, the output of the AND circuit 1504 always has a low level. Thus, the D latch circuit 1502 is only enabled. When the shutter synchronization B enable signal has a low level, the output of the AND circuit 1505 always has a low level. Thus, the D latch circuit 1501 is only enabled. Therefore, control with the second output permission signal A and control with the second output permission signal B are executed alternately every pulse of the internal VD.

Figure 16:
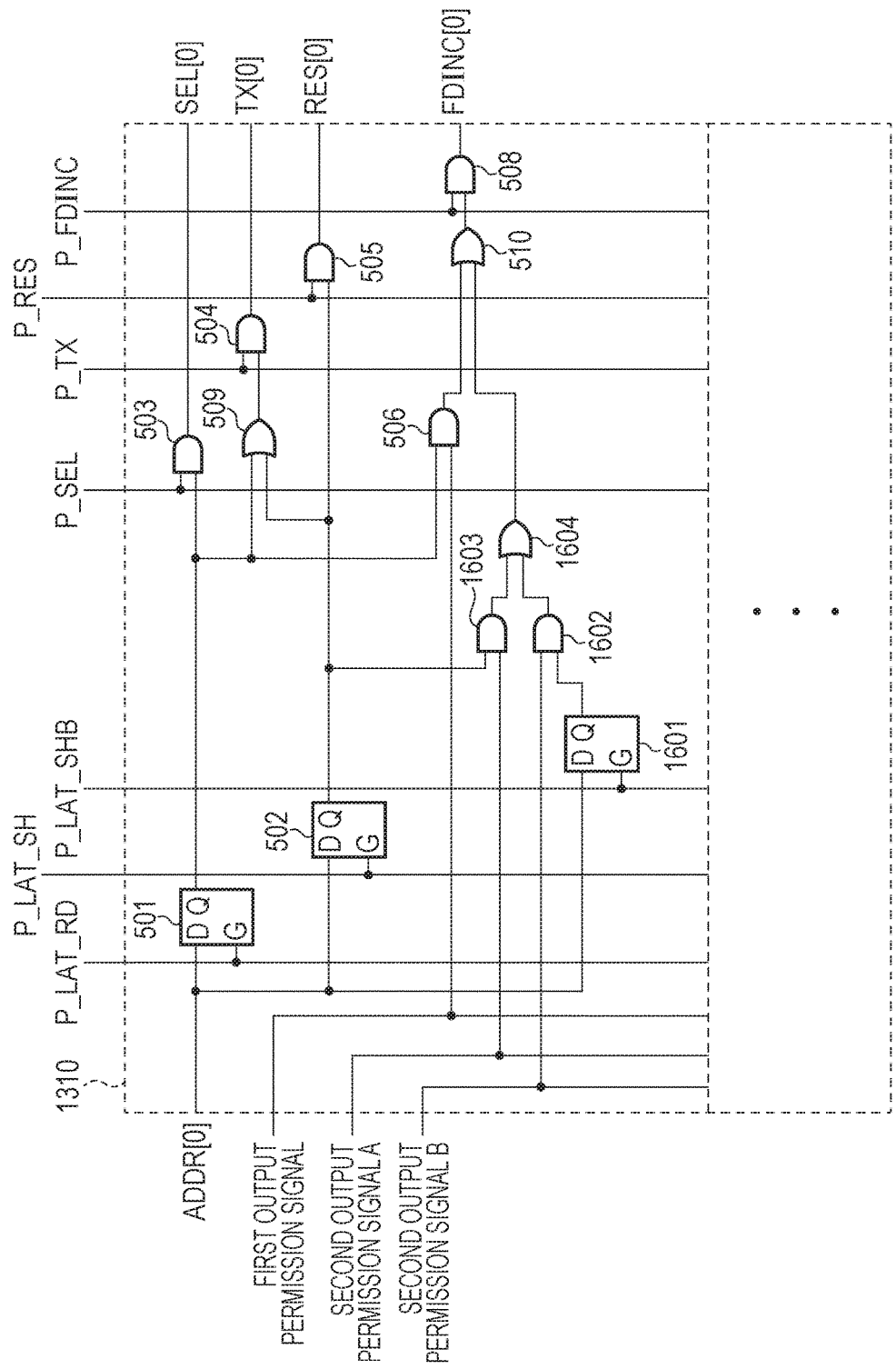
FIG. 16 is a circuit diagram illustrating a configuration of a vertical scanning circuit according to the third exemplary embodiment.

FIG. 16 is a circuit diagram illustrating a configuration of the vertical scanning circuit 1310 according to the third exemplary embodiment. The vertical scanning circuit 1310 has a D latch circuit 1601, AND circuits 1602 and 1603, and an OR circuit 1604 instead of the AND circuit 507 of the vertical scanning circuit 110 according to the first and second exemplary embodiments. Differences from the vertical scanning circuit 110 according to the first and second exemplary embodiments will be described below.

The D latch circuit 1601 has a data terminal D that receives an address signal ADDR[0]. The D latch circuit 1601 has a gate terminal G that receives a signal P_LAT_SHB. When the address signal ADDR[0] has a high level, a signal output from an output terminal Q of the D latch circuit 1601 has a high level since a time when a pulse as a signal P_LAT_SHB is input.

A signal output from the output terminal Q of the D latch circuit 1601 is input to one of two input terminals of the AND circuit 1602. The AND circuit 1602 has the other input terminal that receives the second output permission signal B. The AND circuit 1602 outputs a logical product of the output of the D latch circuit 1601 and the second output permission signal B to one of the input terminals of the OR circuit 1604. The AND circuit 1603 has two input terminals that receive the second output permission signal A and an output signal of the D latch circuit 502, and the AND circuit 1603 outputs a logical product of them to the other input terminal of the OR circuit 1604. The OR circuit 1604 outputs a logical sum of signals from the AND circuits 1602 and 1603 to one of two input terminals of the OR circuit 510.

Figure 17:
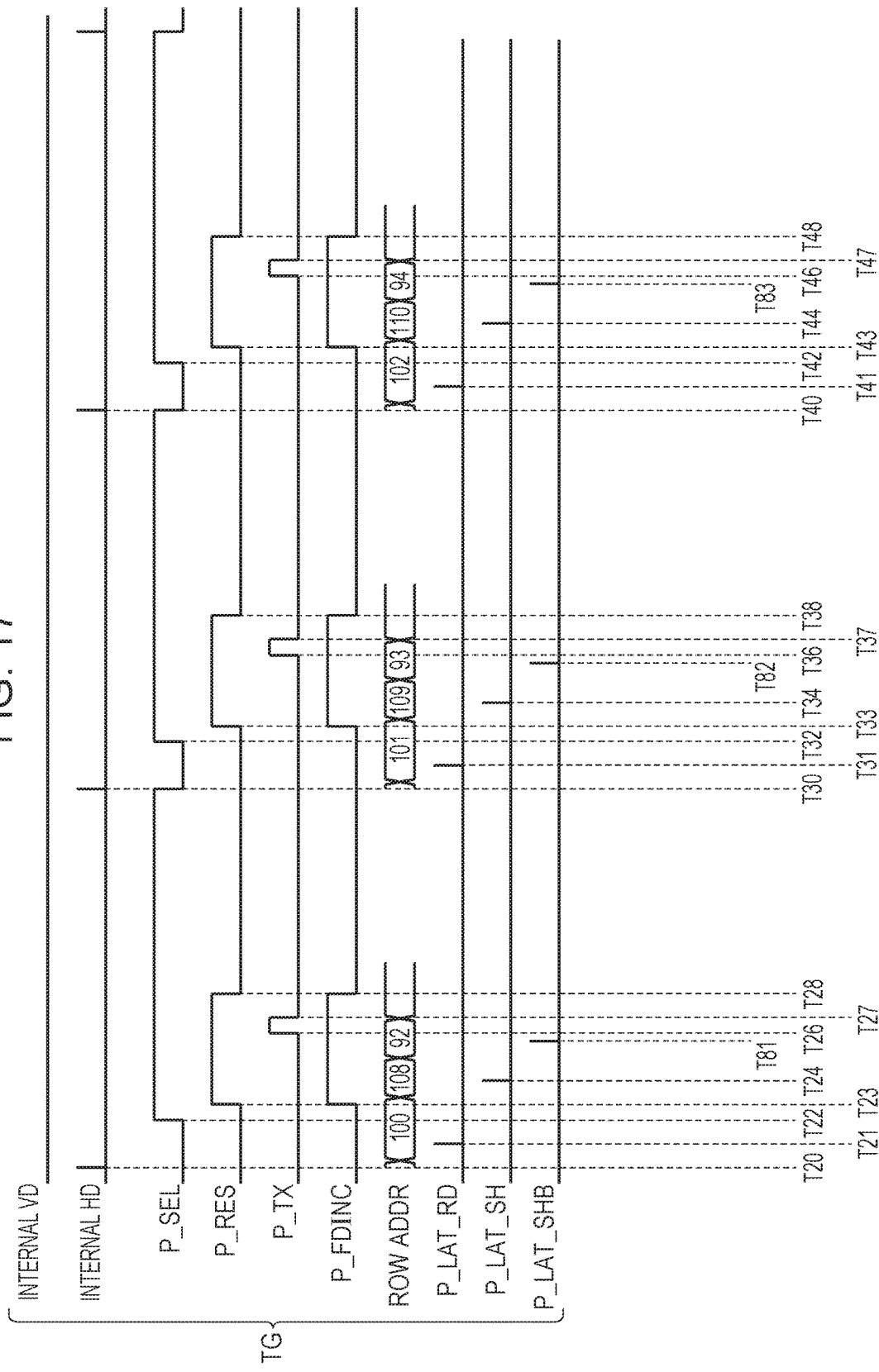
FIG. 17 is an operational timing chart for the imaging apparatus according to the third exemplary embodiment.

FIG. 17 is an operational timing chart of the imaging apparatus according to the third exemplary embodiment. FIG. 17 only illustrates parts relating to output signals from the timing control unit 180. Because operations performed at the same times as those in FIG. 6 are performed in the same manner as those of the first exemplary embodiment, any repetitive description will be omitted. At a time T81 after the time T24 when a pulse of the signal P_LAT_SH is output, the timing control unit 180 outputs a pulse of the signal P_LAT_SHB to the vertical scanning circuit 1310. Because control with the second output permission signal A and control with the second output permission signal B are enabled alternately as described above, a shutter address is one of the 108th row or the 92nd row in the driving in the time period from the time T20 to the time T28. According to this exemplary embodiment, the second capacitance control unit 1370 is capable of outputting two signals of the second output permission signal A and the second output permission signal B, FD capacitances different from each other may be set for two rows for shutter scanning.

On basis of the circuit arrangement and operational timing as described above, driving of the imaging apparatus illustrated in FIG. 14 can be implemented. According to this exemplary embodiment, FD capacitance control for shutter scanning is performed on basis of the second output permission signal A and the second output permission signal B alternately every one frame. For shutter scanning, FD capacitances different from each other may be set for two rows.

Effects of the configuration according to the third exemplary embodiment will be described in comparison with a comparison example. When a moving image is captured by an imaging apparatus, the accumulation time may be changed in accordance with imaging conditions therefor. The accumulation time may be changed by changing the timing of a shutter start. In a comparison example to the third exemplary embodiment, when a timing change for a shutter start is performed, the following problems may possibly occur.

Figure 18:
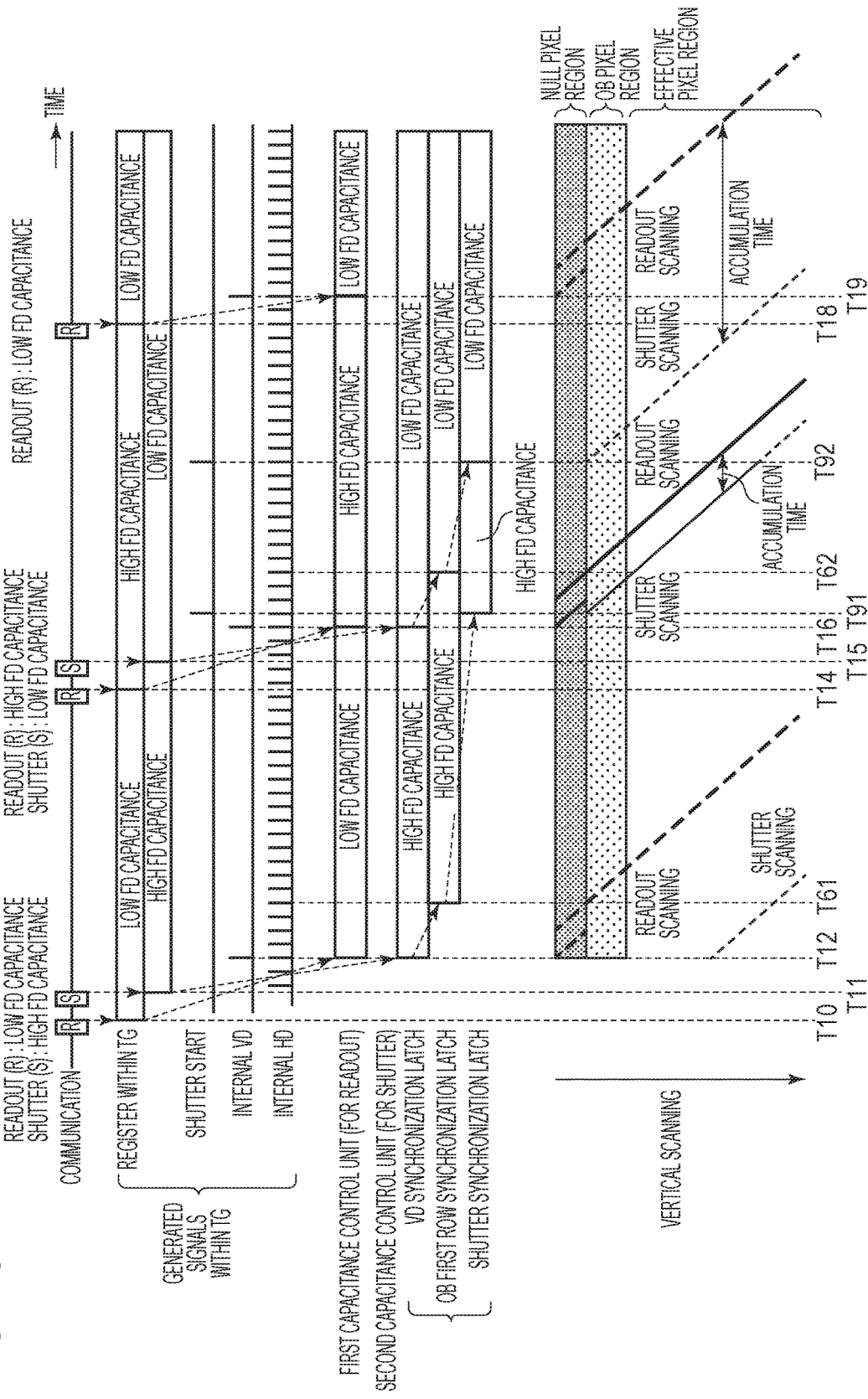
FIG. 18 schematically illustrates a driving method for an imaging apparatus according to a comparison example.

FIG. 18 schematically illustrates a driving method for an imaging apparatus according to the comparison example. FIG. 18 illustrates operations in a case where shutter scanning to be started at a time T13 according to the second exemplary embodiment is delayed to a time T91 because of a timing change of a shutter start. This reduces the accumulation time between shutter scanning to be started from a time T91 and readout scanning to be started from a time T16. Similarly, shutter scanning to be started at a time T17 according to the second exemplary embodiment is advanced to a time T92. This increases the accumulation time between the shutter scanning to be started from the time T92 and the readout scanning to be started from the time T19. In this case, the shutter scanning is performed at shorter intervals, before the shutter scanning to be started from the time T91 ends, the shutter scanning on the next frame (or the shutter scanning to be started from the time T92) starts, resulting in a partial overlap of the time periods for shutter scanning. The shutter scanning from the time T91 is set to be performed with "High FD capacitance", and the shutter scanning from the time T92 is set to be performed with "Low FD capacitance". Thus, the FD capacitance setting changes in the middle of the shutter scanning. Therefore, image quality degradation may possibly occur for the same reason as that in the comparison example to the first exemplary embodiment.

On the other hand, according to the third exemplary embodiment, even though time periods for shutter scanning partially overlap as in the comparison example, the operation may be performed without a change of the FD capacitance setting in the middle of the shutter scanning. Therefore, the imaging apparatus of this exemplary embodiment can reduce image quality degradation due to the reasons as described above.

Fourth Exemplary Embodiment

Figure 19:
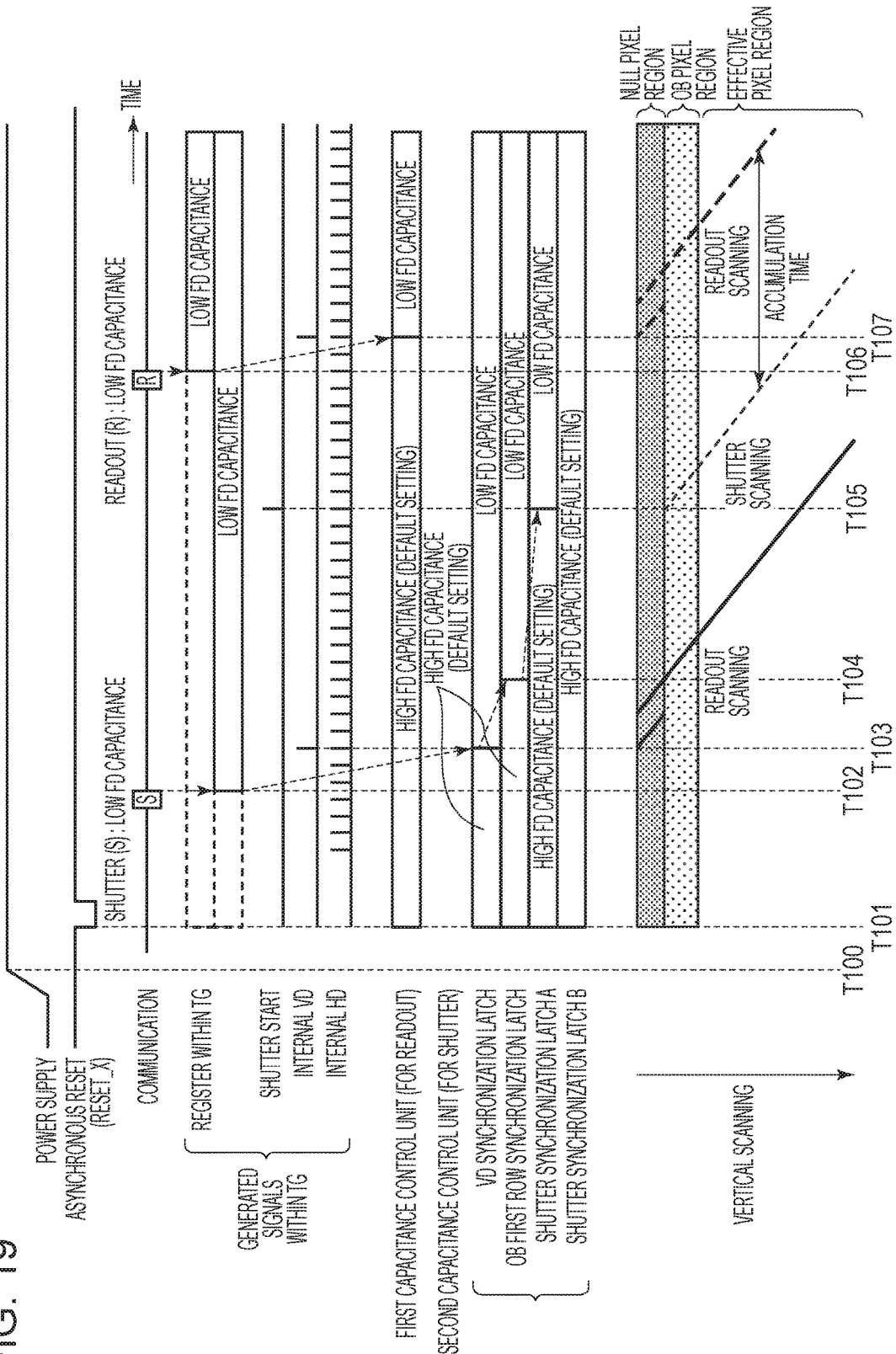
FIG. 19 schematically illustrates a driving method for an imaging apparatus according to a fourth exemplary embodiment.

FIG. 19 schematically illustrates a driving method for an imaging apparatus according to a fourth exemplary embodiment. This exemplary embodiment is different from the driving method according to the third exemplary embodiment in that the default setting (initial setting) for resetting the imaging apparatus is "High FD capacitance". Driving immediately after the imaging apparatus is powered on will be described below.

At a time T100, the imaging apparatus is powered on. At a time T101, a pulse at a low level of an asynchronous reset (RESET_X) is input. In the example in FIG. 19, the reset is executed upon powered on, but the reset may be executed in response to a user operation, for example. At that time, the first capacitance control unit 160 and second capacitance control unit 1370 output signals at a high level indicating "High FD capacitance" as a default setting. Based on that, each of the transistors M5 is turned on so that the floating diffusion FD and the additional capacitor Cinc can be connected.

At a time T102, the timing control unit 180 receives a signal instructing to perform a shutter operation (S) with "Low FD capacitance". Based on the instruction, shutter scanning from a time T105 is performed with "Low FD capacitance". This operation is performed in the same way as that of the third exemplary embodiment. At a time T103, readout scanning is performed with "High FD capacitance". This is because the default setting based on the asynchronous reset is "High FD capacitance" as described above. After that, at a time T106, the timing control unit 180 in response to the signal instructing readout scanning (R) with "Low FD capacitance" performs the same operation as that of the third exemplary embodiment so that the readout scanning from a time T107 can be performed with "Low FD capacitance".

According this exemplary embodiment as described above, the initial operation after a reset is performed with "High FD capacitance" as a default setting so that readout scanning or shutter scanning can be performed with "High FD capacitance" on a frame before an instruction to designate an FD capacitance is received. When the initial operation is performed with "Low FD capacitance", the additional capacitor Cinc has a floating state in readout scanning or reset scanning on an initial number of frames. Thus, the additional capacitor Cinc has an instable potential, which may cause noise, for example. According to this exemplary embodiment, because the default setting is "High FD capacitance" which connects the floating diffusion FD and the additional capacitor Cinc, the additional capacitor Cinc does not have a floating state, which can reduce influences of the problem as described above.

Fifth Exemplary Embodiment

Figure 20:
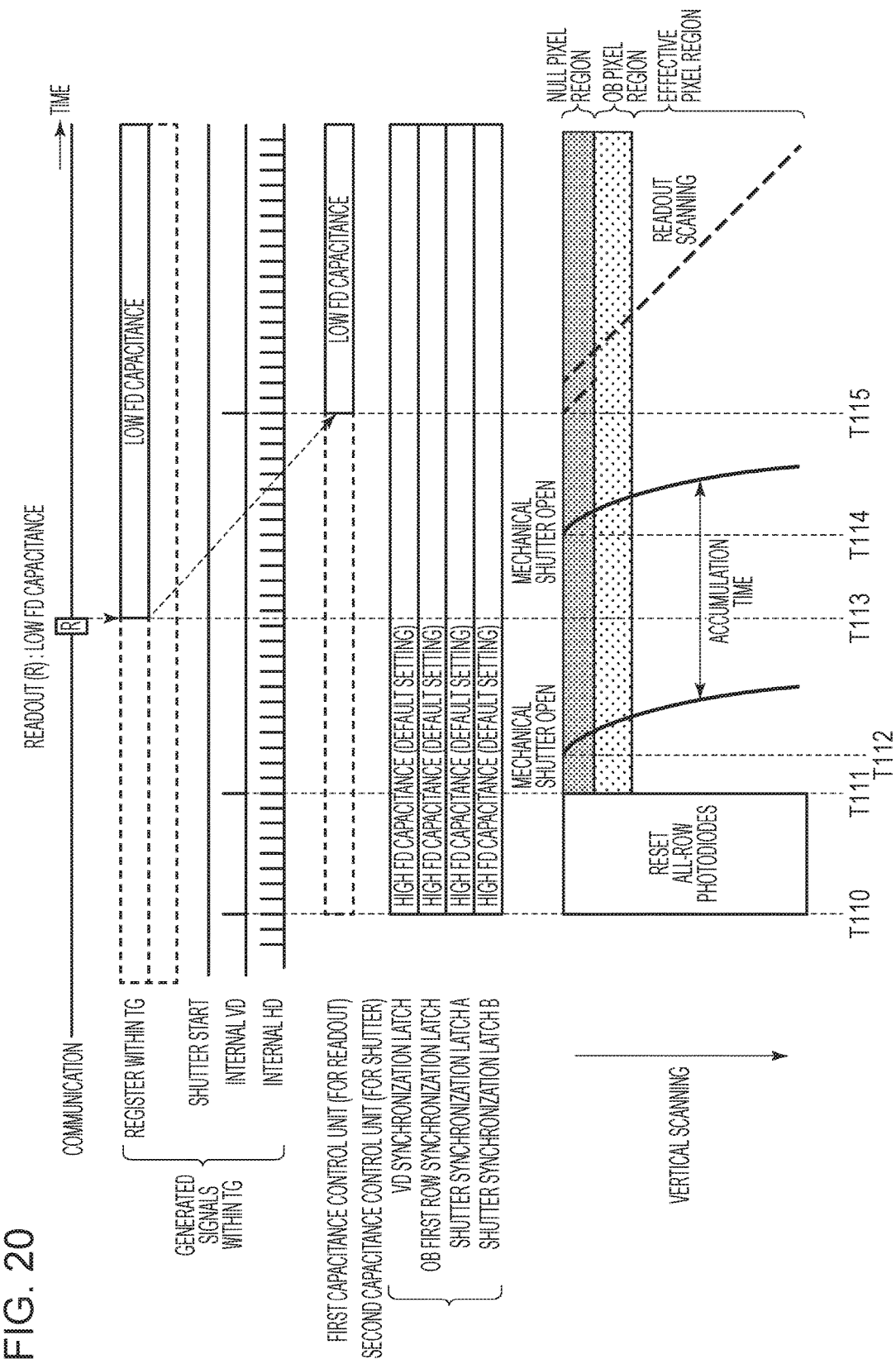
FIG. 20 schematically illustrates a driving method for an imaging apparatus according to a fifth exemplary embodiment.

FIG. 20 schematically illustrates a driving method for an imaging apparatus according to a fifth exemplary embodiment. The imaging apparatus according to this exemplary embodiment is different from the imaging apparatus according to the fourth exemplary embodiment in that a mechanical shutter is further provided so that the mechanical shutter can be used to perform still image radiographing with controllable accumulation times. Because the mechanical shutter is used for exposure time control, the shutter scanning according to the first to fourth embodiments is not performed in this exemplary embodiment.

Operations of the still image radiographing will be described below. For performing still image radiographing by using the mechanical shutter, the second capacitance control unit is set to control to keep the "High FD capacitance" being a default setting, like the reset in the fourth exemplary embodiment. In a time period from a time T110 to a time T111, the photoelectric converting units PD of the pixels 101 of all rows of the pixel array 1000 are reset (all-row photodiode reset). This operation will be described below. In this case, the mechanical shutter has a closing state at that time points.

At a time T112, an opening operation of the mechanical shutter is started, and the pixel array 100 is sequentially exposed from the top row. At a time T113, the timing control unit 180 receives a signal instructing readout scanning (R) with "Low FD capacitance". At a time T114, a closing operation of the mechanical shutter is started, and the exposure of the pixel array 100 is sequentially stopped from the top row. The time period from the open to the closing of the mechanical shutter, that is, the time period from the time T112 to the time T114 corresponds to an accumulation time. For example, assuming that the mechanical shutter has a front curtain and a rear curtain, the time T112 corresponds to the traveling starting time of the front curtain, and the time T114 corresponding to the traveling starting time of the rear curtain. At a time T115, readout scanning with "Low FD capacitance" is sequentially performed. A vertical scanning circuit 2110 and operations thereof will be described below.

Figure 21:
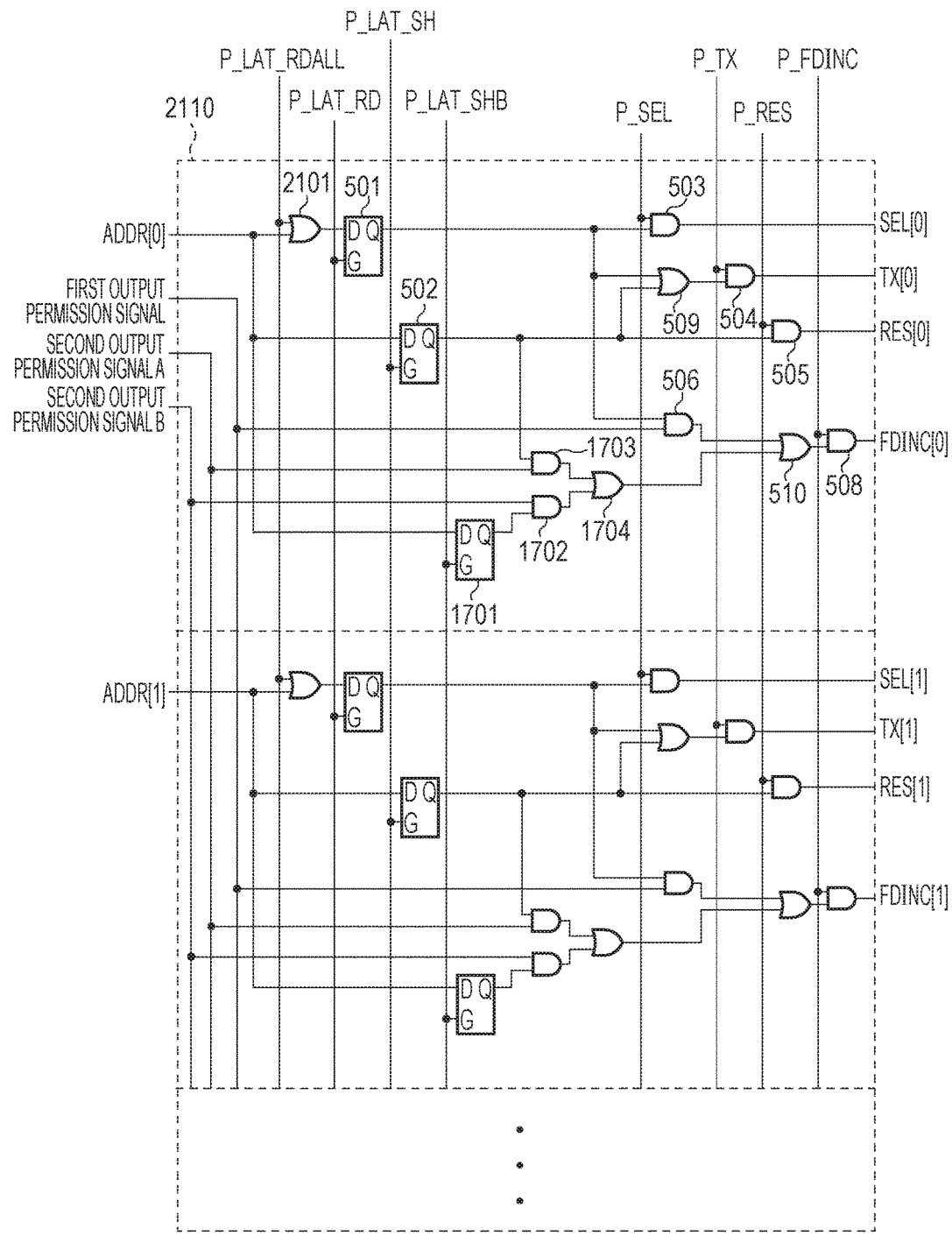
FIG. 21 is a circuit diagram illustrating a configuration of a vertical scanning circuit according to the fifth exemplary embodiment.

FIG. 21 is a circuit diagram illustrating a configuration of the vertical scanning circuit 2110 according to the fifth exemplary embodiment. The vertical scanning circuit 2110 according to this exemplary embodiment is different from the circuit in FIG. 17 according to the third and fourth exemplary embodiments in that an OR circuit 2101 is further provided in a previous stage of the data terminal D of the D latch circuit 501. The OR circuit 2101 has two input terminals one of which receives address signals ADDR[0] to [n] and the other one of which receives a signal P_LAT_RDALL. Because the signal P_LAT_RDALL is commonly input to the OR circuits 2101 of rows, the outputs of the OR circuits 2101 of all of the rows are changed to a high level when the signal P_LAT_RDALL has a high level. In other words, all rows are selected. When the signal P_LAT_RDALL has a low level, the outputs of the OR circuit 2101 are matched with the levels of the address signals ADDR[0] to [n].

Figure 22:
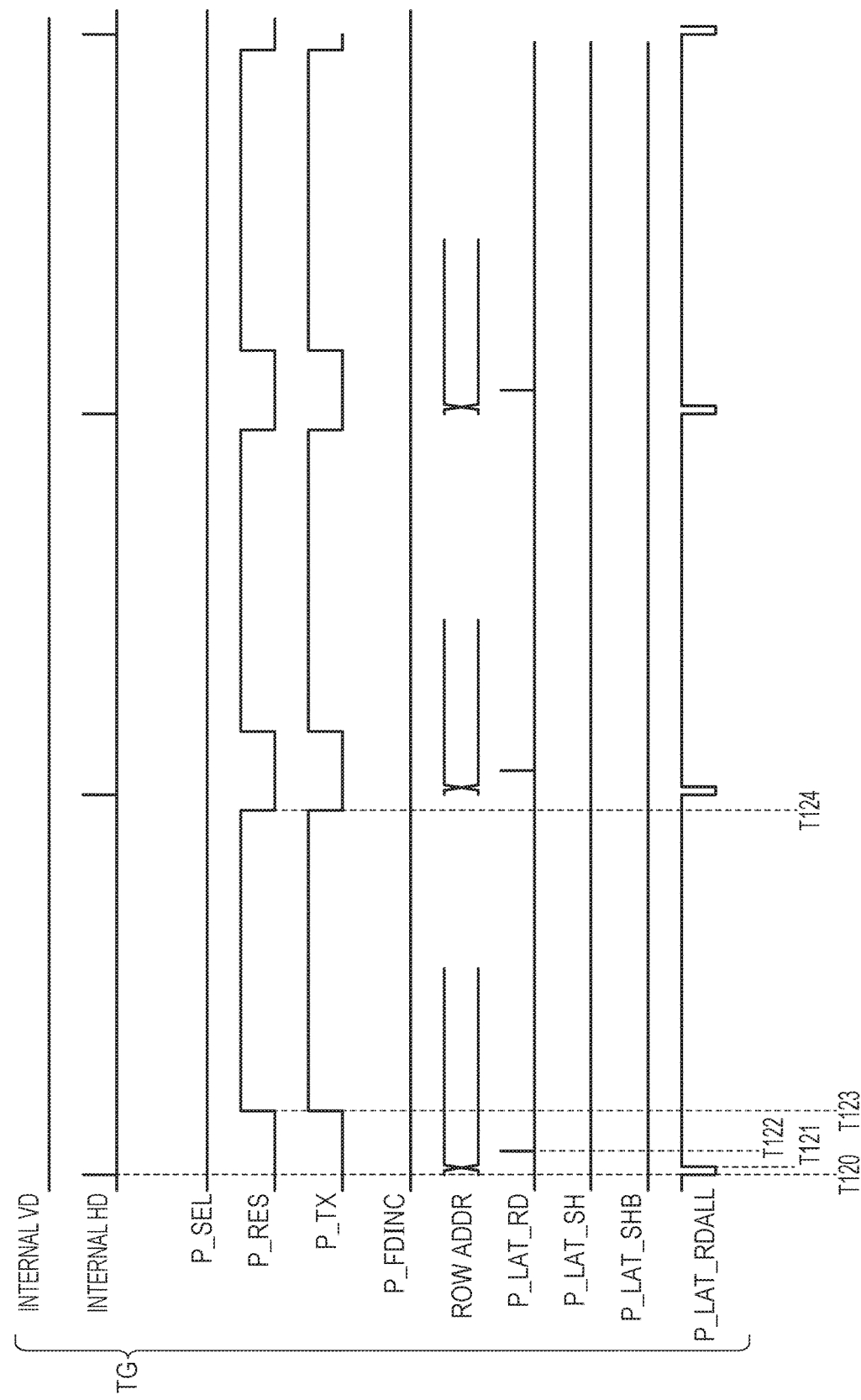
FIG. 22 is an operational timing chart for the imaging apparatus according to the fifth exemplary embodiment.

FIG. 22 is an operational timing chart in a time period for all-row photodiode reset of the imaging apparatus according to the fifth exemplary embodiment. At a time T120, in response to a pulse of the internal HD, the signal P_LAT_RDALL temporarily has a low level and is changed to a high level again at a time T121 after that. Thus, the outputs of the OR circuits 2101 of rows are changed to a high level and are input to the data terminals D of the D latch circuits 501 of the rows. At a time T122, a pulse of the signal P_LAT_RD is input to a gate terminal G of the D latch circuit 501 of each of the rows, and the outputs from output terminals Q of the D latch circuits 501 are changed to a high level.

At a time T123, the signals P_RES and P_TX are changed to a high level. Thus, the control signals RES[0] to [n] and the control signals TX[0] to [n] are all changed to a high level. In other words, the transfer transistors M1 and the reset transistors M2 of all rows are all turned on, and electric charges accumulated in the photoelectric converting units PD of all of the rows are reset. After that, at a time T124, the signals P_RES and P_TX are changed to a low level, and the transfer transistors M1 and the reset transistors M2 of all of the rows are all turned off. These operations are repeated until the time period for the all-row photodiode reset ends. Through these operations, electric charges in the photoelectric converting units PD can be reset together at all rows for preparation for electric charge accumulation through opening and closing of the mechanical shutter. The values of the row addresses indicated by the signals ROW_ADDR, that is, the address signals ADDR[0] to [n] may be arbitrary because they do not have an influence on the operations.

According to this exemplary embodiment as described above, a mechanical shutter which can add the functionality of still image radiographing for controlling the accumulation time may further be provided in the imaging apparatus according to the fourth exemplary embodiment. Because such a mechanical shutter is used, the difference in timing for accumulation of electric charges between rows can be reduced, which can reduce a distortion in an image due to a rolling shutter. Upon reset of photodiodes of all rows and upon accumulation of electric charges, the second capacitance control unit provides "High FD capacitance" as a default setting, that is, connects the floating diffusions FD and the additional capacitors Cinc. Thus, the additional capacitors Cinc are not floated, which can also reduce the influence of the problems solved by the fourth exemplary embodiment.

Sixth Exemplary Embodiment

Figure 23:
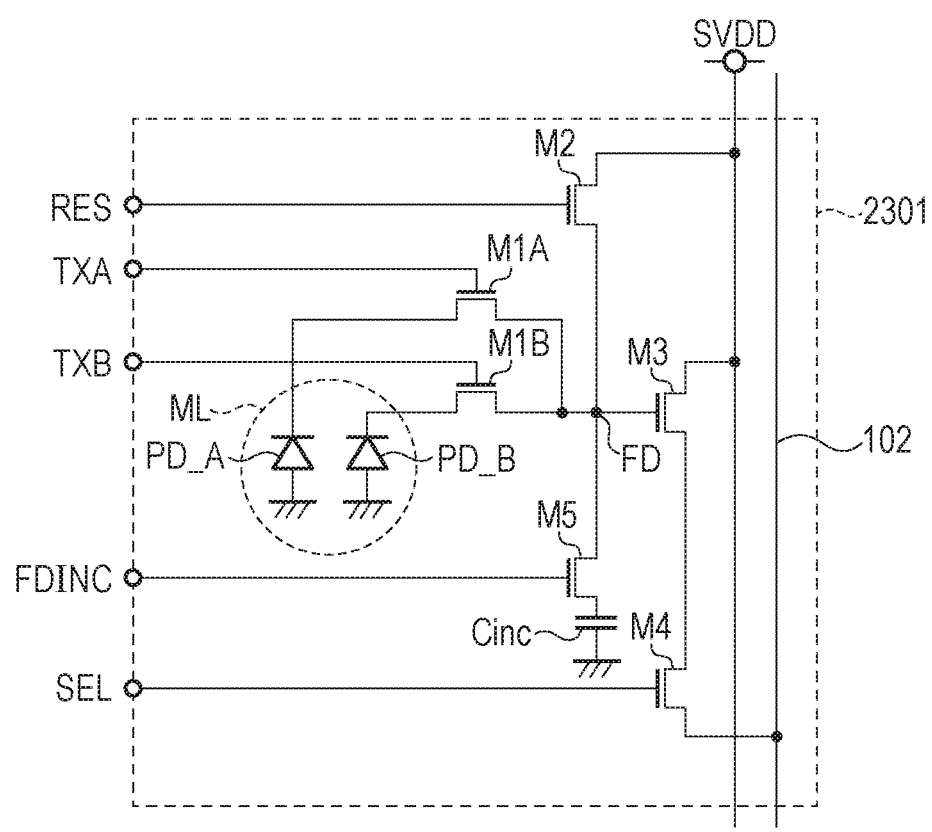
FIG. 23 is a circuit diagram illustrating a configuration of a pixel according to a sixth exemplary embodiment.

FIG. 23 is a circuit diagram illustrating a configuration of pixels according to a sixth exemplary embodiment. According to this exemplary embodiment, the configuration of pixels 2301 is different from the pixels 101 according to the first to fifth exemplary embodiments. Each of the pixels 2301 according to this exemplary embodiment has two photoelectric converting units PD_A and PD_B and two tow transfer transistor M1A and M1B. The pixels 2301 are provided on a semiconductor substrate. One microlens ML is provided above a part having the photoelectric converting units PD_A and PD_B and guides incident light to the photoelectric converting units PD_A and PD_B. In other words, the photoelectric converting units PD_A and PD_B are shared by the one microlens ML.

Each of the photoelectric converting units PD_A and PD_B has an anode being grounded. The photoelectric converting unit PD_A has a cathode that is connected to a source of the transfer transistor M1A. The photoelectric converting unit PD_B has a cathode that is connected to a source of the transfer transistor M1B. Each of the transfer transistors M1A and M1B has a drain that is connected to a floating diffusion FD. The transfer transistor M1A has a gate that receives a control signal TXA, and the transfer transistor M1B has a gate that receives a control signal TXB.

Figure 24:
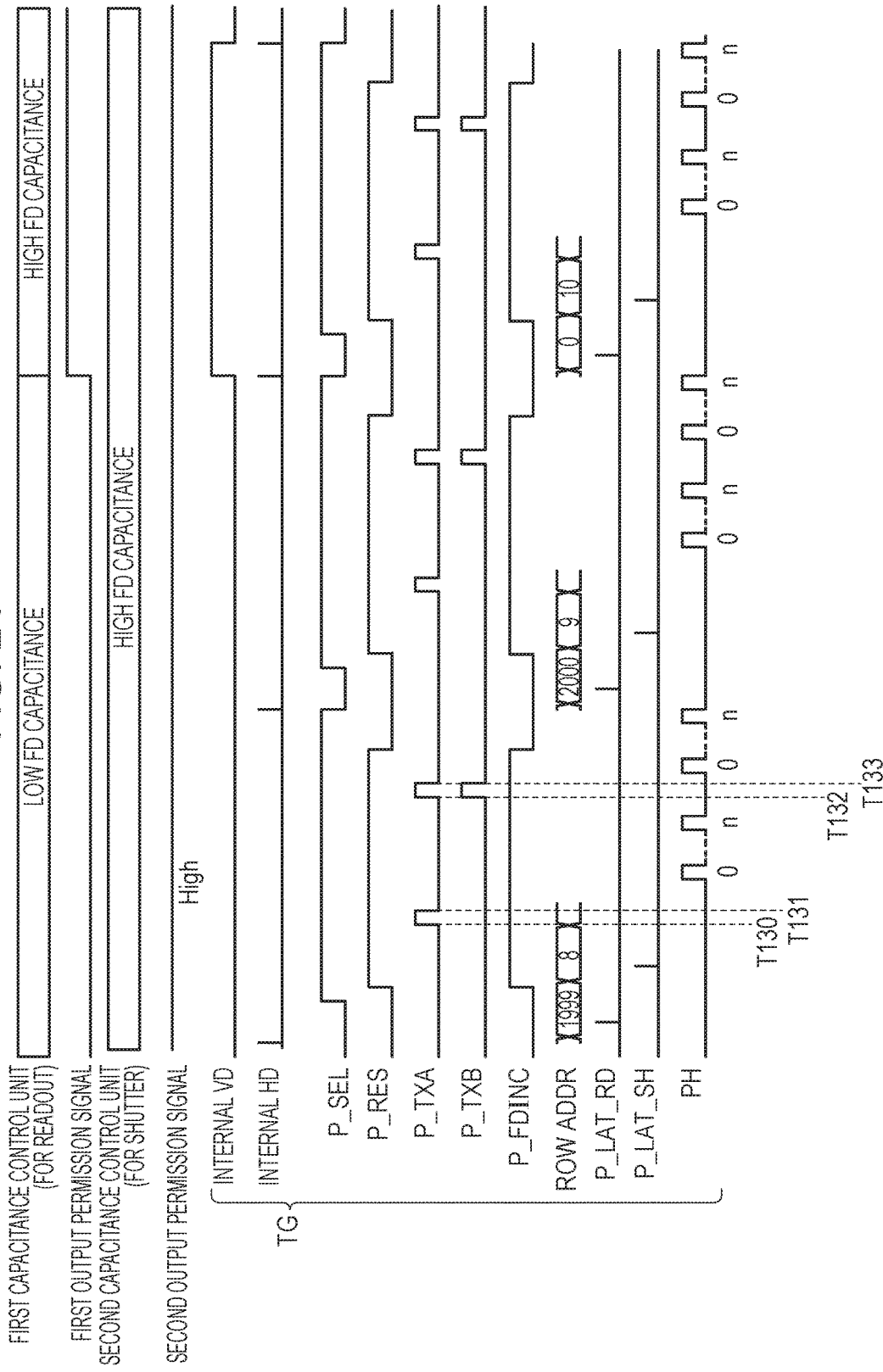
FIG. 24 is an operational timing chart for an imaging apparatus according to the sixth exemplary embodiment.

FIG. 24 is an operational timing chart for the imaging apparatus according to the sixth exemplary embodiment. Operations of this exemplary embodiment are different from those of the first to fifth exemplary embodiments in that the signal P_TX according to the first to fifth exemplary embodiments is divided into two signals P_TXA and P_TXB according to this exemplary embodiment. The signal P_TXA is a signal that controls pulses of control signals TXA[0] to [n], and the signal P_TXB is a signal that controls pulses of control signals TXB[0] to [n]. Because the configurations and operations within a vertical scanning circuit configured to generate pulses of those control signals are substantially the same as those of the first to fifth exemplary embodiments, any repetitive description will be omitted.

At a time T130, the signal P_TXA is changed to a high level. Thus, the control signals TXA[8] and TXA[1999] are changed to a high level. This operation, like the first exemplary embodiment, resets the electric charges in the photoelectric converting units PD_A and floating diffusions FD of the pixels 2301 of the eighth row, and a signal readout operation is performed on basis of the photoelectric converting units PD_A of the pixels 2301 of the 1999th row. After that, at a time T131, the signal P_TXA is changed to a low level.

At a time T132, the signals P_TXA and P_TXB are changed to a high level. Thus, the control signals TXA[8], TXA[1999], TXB[8], and TXB[1999] are changed to a high level. This operation resets electric charges in the photoelectric converting units PD_A and PD_B and floating diffusions FD of the pixel 2301 in the eighth row. Furthermore, a signal readout operation based on the photoelectric converting units PD_A and PD_B of the pixels 2301 in the 1999th row. After that, at a time T133, the signals P_TXA and P_TXB are changed to a low level.

According to this exemplary embodiment as described above, a signal (A signal) based on electric charges generated in the corresponding photoelectric converting unit PD_A is read from the pixels 2301 in the time period from the time T130 to the time T131. Then, in response to the sequential changes of the signals PH to a high level, the A signal is read out from the signal holding units 131 of the columns. After that, in the time period from the time T132 to the time T133, a signal (A+B signal) based on a sum of electric charges generated in the photoelectric converting units PD_A and PD_B is read from the pixels 2301. In response to the sequential change of each of the signals PH to a high level, the A+B signals are read out from the signal holding units 131 of the columns. A signal processing unit within the imaging apparatus or in a following stage of the imaging apparatus subtracts the A signal from the A+B signal so that the signal (B signal) based on electric charges generated in the photoelectric converting unit PD_B can be calculated. The A signal and B signal may be used for phase difference auto-focus of the imaging apparatus, for example. The A+B signal may be used for generating an image. In other words, according to this exemplary embodiment, the imaging apparatuses according to the first to fifth exemplary embodiments may be applicable to an imaging apparatus having a pixel configuration in which each one pixel has a plurality of photoelectric converting units. The resulting plurality of signals may be used not only for generating an image but also for phase difference auto-focus, for example.

According to this exemplary embodiment, each of the pixels 2301 has the two photoelectric converting units PD_A and PD_B. However, each of the pixels 2301 may have three or more photoelectric converting units.

Seventh Exemplary Embodiment

Figure 25:
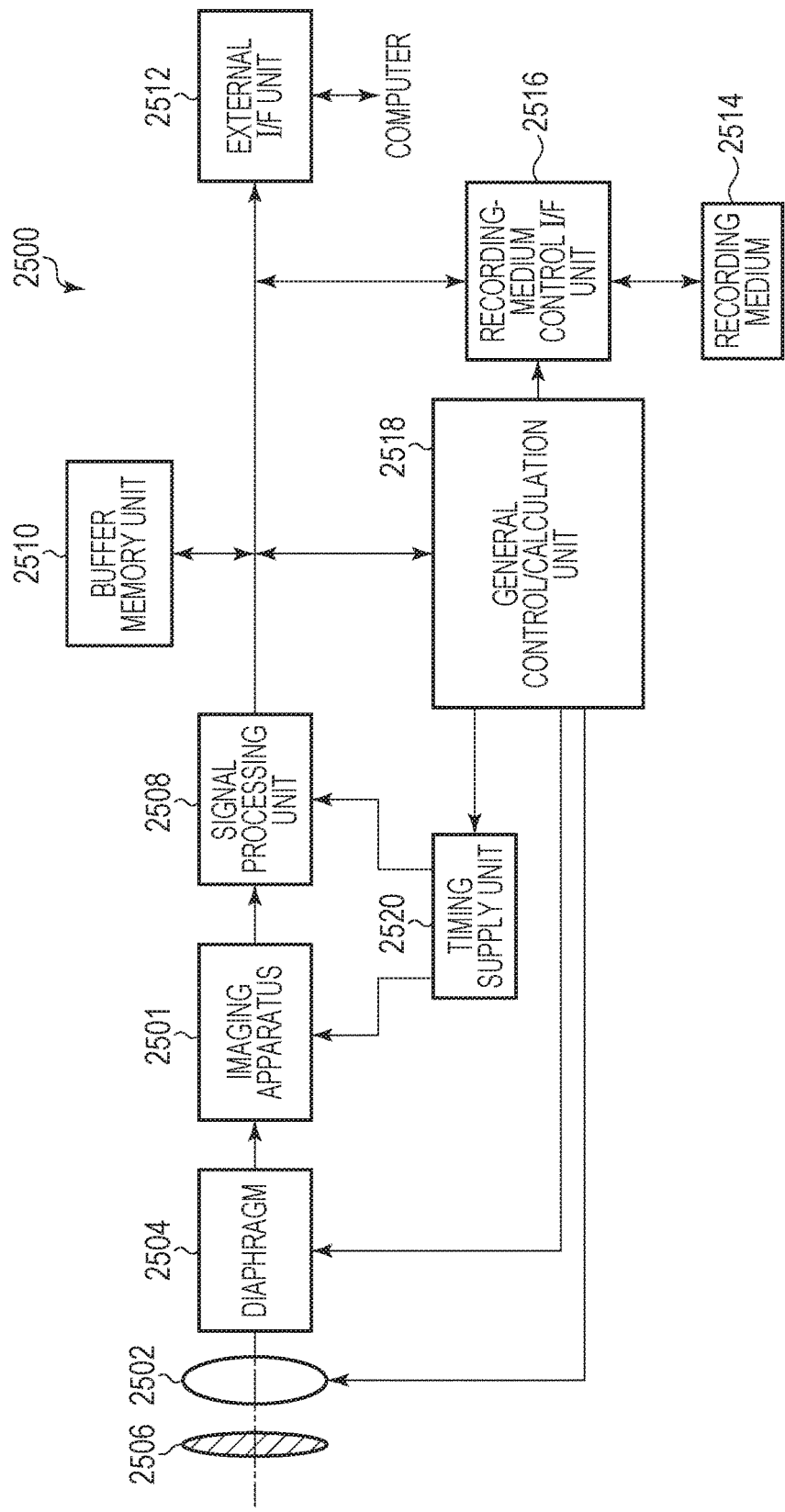
FIG. 25 is a block diagram illustrating an imaging system according to a seventh exemplary embodiment.

An imaging system according to a seventh exemplary embodiment will be described. The imaging system may be a digital still camera, a digital camcorder, a copier, a facsimile, a cellular phone, a vehicle-mounted camera, or an observation satellite, for example. The imaging system may further be a camera module including an optical system such as a lens and an imaging apparatus. FIG. 25 illustrates a block diagram of a digital still camera as an example of the imaging system.

An imaging system 2500 includes a barrier 2506, a lens 2502, a diaphragm 2504 and an imaging apparatus 2501 as an optical system and an imaging unit. The barrier 2506 is a member configured to protect the lens 2502. The lens 2502 is configured to form an optical image of an object on a pixel array 100 of the imaging apparatus 2501. The diaphragm 2504 is configured to set the light quantity to pass through the lens 2502. The imaging apparatus 2501 may be the imaging apparatus according to any one of the aforementioned exemplary embodiments. The imaging apparatus 2501 is configured to convert an optical image formed on the pixel array 100 by the lens 2502 to image data. Here, the imaging apparatus 2501 may include an AD converting unit, or an AD converting unit, not illustrated, may be added in a following stage of the imaging apparatus 2501.

The imaging system 2500 may further include a signal processing unit 2508, a timing supply unit 2520, and a general control/calculation unit 2518 as components configured to perform control, signal processing, and so on. The imaging system 2500 further includes a buffer memory unit 2510, a recording medium control I/F unit 2516, a recording medium 2514, and an external I/F unit 2512 as components configured to data recording and interfacing (I/F).

The signal processing unit 2508 is configured to perform processing such as correction and data compression on image data output from the imaging apparatus 2501. This processing may include correlated double sampling and digital gain correction processing. The timing supply unit 2520 may output timing signals to the imaging apparatus 2501 and the signal processing unit 2508. The general control/calculation unit 2518 generally controls over the digital still camera. The buffer memory unit 2510 is a frame memory configured to temporarily store image data. The recording medium control I/F unit 2516 may be an interface unit configured to write or read data to or from the recording medium 2514. The recording medium 2514 is a non-volatile recording medium such as a semiconductor memory configured to record image data, for example. The recording medium 2514 may be built in the imaging system 2500 or may be detachably mounted to the imaging system 2500. The external I/F unit 2512 is an interface unit configured to execute communication between the imaging system 2500 and an external computer. Here, a control signal such as a timing signal may be input externally to the imaging system 2500. The imaging system 2500 may have at least the imaging apparatus 2501 and the signal processing unit 2508 configured to process a signal output from the imaging apparatus 2501.

The imaging system according to this exemplary embodiment can apply the imaging apparatus 2501 according to any one of the aforementioned exemplary embodiments to implement imaging operations, as described above.

Exemplary embodiments are not limited to the aforementioned exemplary embodiments. For example, it should be understood that the disclosure is applicable to an embodiment having a partial configuration of any one of the aforementioned exemplary embodiments in addition to any one of the other exemplary embodiments or replaced by a partial configuration of the other exemplary embodiments.

The imaging system according to the seventh exemplary embodiment is merely given as an example of an imaging system to which the imaging apparatus of according to an aspect of the disclosure is applicable, and the imaging system to which an imaging apparatus according to an aspect of the disclosure is not limited to the configuration illustrated in FIG. 25.

According to the aforementioned exemplary embodiments, an imaging apparatus can be provided in which the capacitance values of floating diffusions therein can be controlled.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2015-233675 filed Nov. 30, 2015, which is hereby incorporated by reference herein in its entirety.

What is claimed is:

1. An imaging apparatus comprising:
   a pixel array having a plurality of rows of a plurality of pixels, the pixels each including:
   a photoelectric converting unit configured to generate electric charges corresponding to incident light;
   an amplification transistor having an input node, the amplification transistor configured to output a signal corresponding to electric charges in the input node;
   a transfer transistor configured to transfer the electric charges generated by the photoelectric converting unit to the input node;
   a reset transistor configured to reset the input node to a predetermined voltage; and
   a capacitance setting unit configured to set a capacitance value of the input node,
   a scanning circuit configured to perform shutter scanning sequentially performing processing of resetting electric charges of the photoelectric converting units on each row of the plurality of pixels by turning on the transfer transistors and the reset transistors, and readout scanning sequentially performing processing of transferring electric charges of the photoelectric converting unit to the input node on each row of the plurality of pixels by turning on the transfer transistors;
   a first control unit configured to control the capacitance setting unit to set a capacitance value of the input node in the readout scanning; and
   a second control unit configured to control the capacitance setting unit to set a capacitance value of the input node in the shutter scanning.

2. The imaging apparatus according to claim 1, the shutter scanning on a part of the rows and the readout scanning on a part of the rows are performed in parallel in an identical time period.

3. The imaging apparatus according to claim 1,
   wherein while the scanning circuit is performing the readout scanning on all rows of the plurality of pixels, the first control unit controls the capacitance setting unit such that the capacitance setting unit does not change the capacitance value of the input node; and
   wherein while the scanning circuit is performing the shutter scanning on all rows of the plurality of pixels, the second control unit controls the capacitance setting unit such that the capacitance setting unit changes the capacitance value of the input node.

4. The imaging apparatus according to claim 2,
   wherein while the scanning circuit is performing the readout scanning on all rows of the plurality of pixels, the first control unit controls the capacitance setting unit such that the capacitance setting unit does not change the capacitance value of the input node; and
   wherein while the scanning circuit is performing the shutter scanning on all rows of the plurality of pixels, the second control unit controls the capacitance setting unit such that the capacitance setting unit changes the capacitance value of the input node.

5. The imaging apparatus according to claim 1,
wherein the first control unit controls the capacitance setting unit such that the capacitance setting unit sets the capacitance value of the input node in synchronism with a time when the scanning circuit starts the readout scanning; and
wherein the second control unit controls the capacitance setting unit such that the capacitance setting unit sets the capacitance value of the input node in synchronism with a time when the scanning circuit starts the shutter scanning.

6. The imaging apparatus according to claim 4,
wherein the first control unit controls the capacitance setting unit such that the capacitance setting unit sets the capacitance value of the input node in synchronism with a time when the scanning circuit starts the readout scanning; and
wherein the second control unit controls the capacitance setting unit such that the capacitance setting unit sets the capacitance value of the input node in synchronism with a time when the scanning circuit starts the shutter scanning.

7. The imaging apparatus according to claim 1, wherein, in a series of the readout scanning and the shutter scanning for acquiring an image of an identical frame, the first control unit and the second control unit control the capacitance setting unit to set the capacitance value of the input node in the readout scanning and the capacitance value of the input node in the shutter scanning to an equal capacitance value.

8. The imaging apparatus according to claim 6, wherein, in a series of the readout scanning and the shutter scanning for acquiring an image of an identical frame, the first control unit and the second control unit control the capacitance setting unit to set the capacitance value of the input node in the readout scanning and the capacitance value of the input node in the shutter scanning to an equal capacitance value.

9. The imaging apparatus according to claim 1, wherein the capacitance setting unit sets the capacitance value of the input node by changing a capacitance value to be added to a predetermined capacitor of the input node.

10. The imaging apparatus according to claim 8, wherein the capacitance setting unit sets the capacitance value of the input node by changing a capacitance value to be added to a predetermined capacitor of the input node.

11. The imaging apparatus according to claim 9, the capacitance setting unit having an additional capacitor, wherein the capacitance setting unit sets the capacitance value of the input node by connecting or disconnecting the additional capacitor to a predetermined capacitor of the input node.

12. The imaging apparatus according to claim 10, the capacitance setting unit having an additional capacitor, wherein the capacitance setting unit sets the capacitance value of the input node by connecting or disconnecting the additional capacitor to a predetermined capacitor of the input node.

13. The imaging apparatus according to claim 1,
wherein the pixel array further has a plurality of rows of a plurality of dummy pixels not including the photoelectric converting unit and a plurality of rows of a plurality of light shielded pixels having the photoelectric converting units shielded from light; and
wherein, after the scanning circuit starts the readout scanning on the dummy pixels and the light shielded pixels, the second control unit controls the capacitance setting unit such that the capacitance setting unit sets a capacitance value of the input node in synchronism with a time when the scanning circuit starts the shutter scanning.

14. The imaging apparatus according to claim 12,
wherein the pixel array further has a plurality of rows of a plurality of dummy pixels not including the photoelectric converting unit and a plurality of rows of a plurality of light shielded pixels having the photoelectric converting units shielded from light; and
wherein, after the scanning circuit starts the readout scanning on the dummy pixels and the light shielded pixels, the second control unit controls the capacitance setting unit such that the capacitance setting unit sets a capacitance value of the input node in synchronism with a time when the scanning circuit starts the shutter scanning.

15. The imaging apparatus according to claim 14, wherein the second control unit is capable of capacitance setting values different from each other for the input nodes of two rows of the pixel array.

16. The imaging apparatus according to claim 15,
wherein the capacitance setting unit is configured to set the capacitance values of the input nodes to at least one of a first capacitance value and a second capacitance value higher than the first capacitance value; and
wherein, as an initial setting for the imaging apparatus, the first control unit and the second control unit both control the capacitance setting unit to set the capacitance values of the input nodes to the second capacitance value.

17. The imaging apparatus according to claim 16,
wherein the capacitance setting unit is configured to set the capacitance values of the input nodes to at least one of a first capacitance value and a second capacitance value higher than the first capacitance value;
wherein, in still image radiographing using a mechanical shutter, the second control unit controls the capacitance setting unit to always set the capacitance values of the input nodes to the second capacitance value.

18. The imaging apparatus according to claim 17,
wherein each of the plurality of pixels includes:
a plurality of the photoelectric converting units to which light guided by one microlens enters; and
a plurality of the transfer transistors configured to transfer electric charges generated by the plurality of photoelectric converting units to the input nodes.

19. An imaging system comprising:
an imaging apparatus; and
a signal processing unit configured to process a signal output from the imaging apparatus,
the imaging apparatus having
a pixel array having a plurality of rows of a plurality of pixels, the pixels each including:
a photoelectric converting unit configured to generate electric charges corresponding to incident light;
an amplification transistor having an input node, the amplification transistor configured to output a signal corresponding to electric charges in the input node;
a transfer transistor configured to transfer the electric charges generated by the photoelectric converting unit to the input node;
a reset transistor configured to reset the input node to a predetermined voltage; and
a capacitance setting unit configured to set a capacitance value of the input node,
a scanning circuit configured to perform shutter scanning sequentially performing processing of resetting electric charges of the photoelectric converting units on each row of the plurality of pixels by turning on the transfer transistors and the reset transistors and readout scanning sequentially performing processing of transferring electric charges of the photoelectric converting unit to the input node on each row of the plurality of pixels by turning on the transfer transistors;
a first control unit configured to control the capacitance setting unit to set a capacitance value of the input node in the readout scanning; and
a second control unit configured to control the capacitance setting unit to set a capacitance value of the input node in the shutter scanning.

20. A driving method for an imaging apparatus, the imaging apparatus having a pixel array having a plurality of rows of a plurality of pixels, the pixels each including:
   a photoelectric converting unit configured to generate electric charges corresponding to incident light;
   an amplification transistor having an input node, the amplification transistor configured to output a signal corresponding to electric charges in the input node;
   a capacitance setting unit configured to set a capacitance value of the input node, the method comprising:
performing shutter scanning sequentially performing processing of resetting electric charges of the photoelectric converting units on each row of the plurality of pixels and readout scanning sequentially performing processing of transferring electric charges of the photoelectric converting unit to the input node on each row of the plurality of pixels; and separately performing control of the capacitance setting unit to set a capacitance value of the input node in the readout scanning by a first control unit; and control of the capacitance setting unit to set a capacitance value of the input node in the shutter scanning by a second control unit.

* * * * *